(12) United States Patent
Ohsawa

(10) Patent No.: US 8,208,227 B2
(45) Date of Patent: Jun. 26, 2012

(54) SUSPENSION BOARD WITH CIRCUIT AND PRODUCING METHOD THEREOF

(75) Inventor: Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/317,107

(22) Filed: Oct. 11, 2011

(65) Prior Publication Data

US 2012/0092794 A1    Apr. 19, 2012

Related U.S. Application Data

(60) Provisional application No. 61/344,832, filed on Oct. 20, 2010.

(30) Foreign Application Priority Data

Oct. 12, 2010 (JP) ................................ 2010-229341
Jul. 21, 2011 (JP) ................................ 2011-159688

(51) Int. Cl.
    *G11B 5/48* (2006.01)
(52) U.S. Cl. .................................................. 360/245.9
(58) Field of Classification Search ............... 360/245.9, 360/245.7, 245.3, 245.8, 245, 245.4, 244.3, 360/234.5, 244.8, 244.1, 244
See application file for complete search history.

(56) References Cited

U.S. PATENT DOCUMENTS

| | | | | |
|---|---|---|---|---|
| 7,075,701 B2 * | 7/2006 | Novotny et al. | .............. | 359/291 |
| 7,375,874 B1 * | 5/2008 | Novotny et al. | .............. | 359/291 |
| 7,440,236 B1 * | 10/2008 | Bennin et al. | .............. | 360/294.4 |
| 7,652,890 B2 * | 1/2010 | Ohsawa et al. | .............. | 361/749 |
| 7,876,664 B2 * | 1/2011 | Tsukagoshi et al. | ....... | 369/275.1 |
| 2007/0177302 A1 | 8/2007 | Shimazawa et al. | | |
| 2007/0242921 A1 | 10/2007 | Matsumoto | | |
| 2008/0130155 A1 | 6/2008 | Naniwa et al. | | |
| 2009/0151994 A1 * | 6/2009 | Ohsawa et al. | .............. | 174/261 |
| 2010/0118443 A1 | 5/2010 | Ohsawa et al. | | |
| 2010/0176827 A1 * | 7/2010 | Yamazaki et al. | ............. | 324/699 |
| 2010/0195474 A1 * | 8/2010 | Tsukuda et al. | ......... | 369/112.23 |
| 2012/0067626 A1 * | 3/2012 | Mizutani | ........................ | 174/255 |

FOREIGN PATENT DOCUMENTS

| | | |
|---|---|---|
| JP | 2007-052918 | 3/2007 |
| JP | 2007-207349 | 8/2007 |
| JP | 2007-280572 | 10/2007 |
| JP | 2008-130106 | 6/2008 |
| JP | 2010-118096 | 5/2010 |

* cited by examiner

*Primary Examiner* — Allen Cao
(74) *Attorney, Agent, or Firm* — Jean C. Edwards, Esq.; Edwards Neils PLLC

(57) ABSTRACT

A suspension board with circuit includes a metal supporting board, an insulating layer formed on the metal supporting board, and a conductive layer formed on the insulating layer. The insulating layer includes a first insulating layer and a second insulating layer. The conductive layer includes a first conductive pattern and a second conductive pattern. The first conductive pattern includes a first connecting portion formed on the first insulating layer and under the second insulating layer and a first terminal. The second conductive pattern includes a second connecting portion formed on the second insulating layer and a second terminal. The suspension board with circuit is formed with an opening, and a slider is provided such that an electronic element is inserted in the opening to be electrically connected to the first terminal and a magnetic head on the slider is electrically connected to the second terminal.

9 Claims, 18 Drawing Sheets

FIG.5
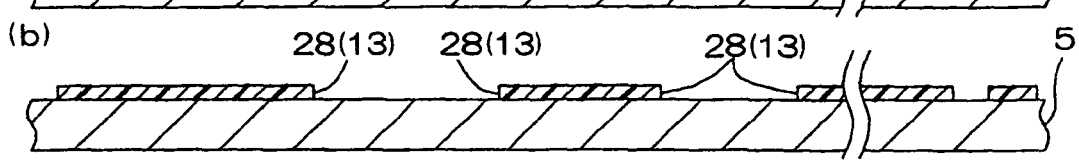
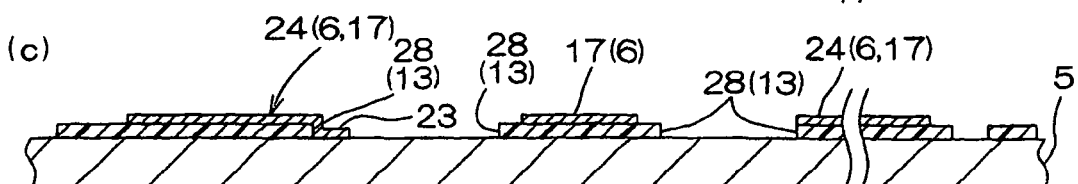
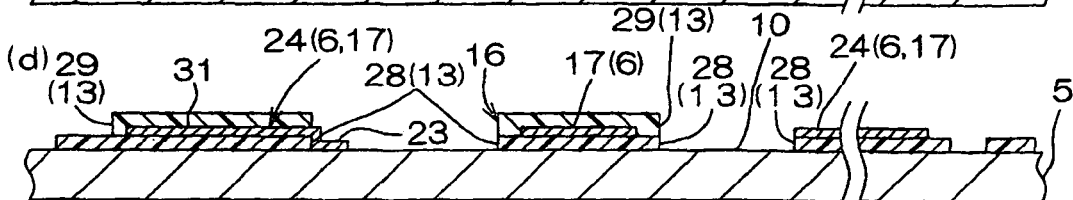
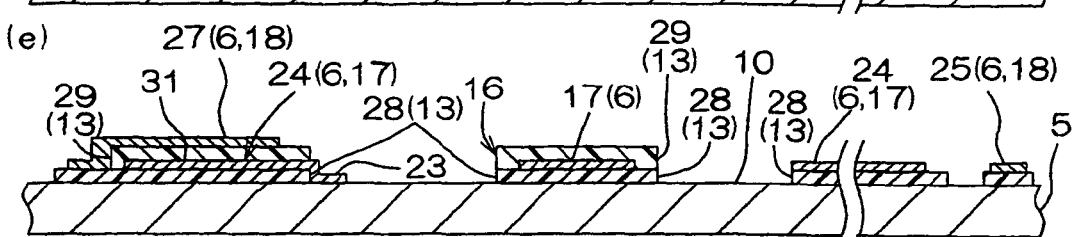
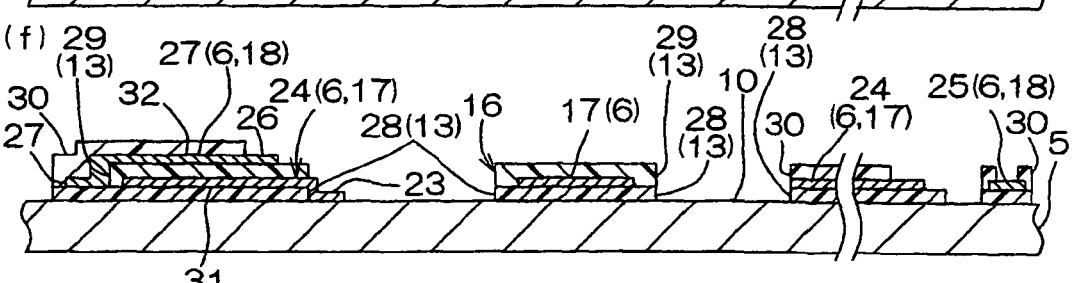
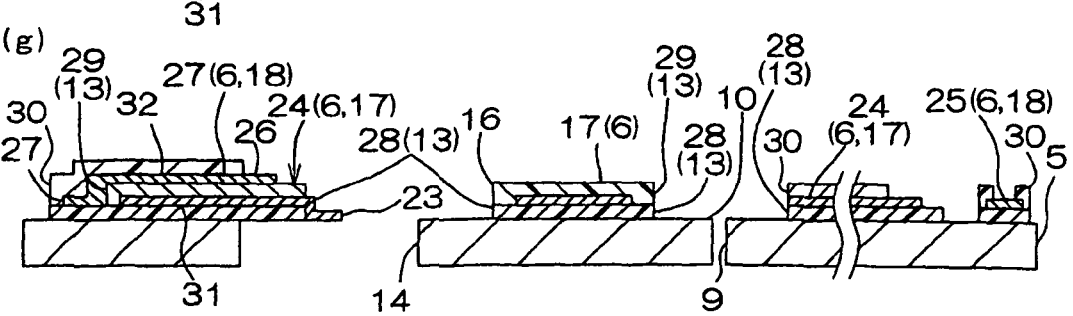

FIG.6
(a)
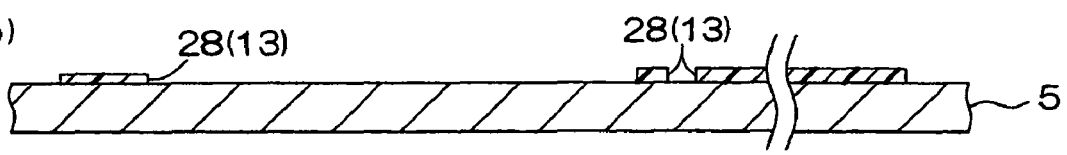
(b)
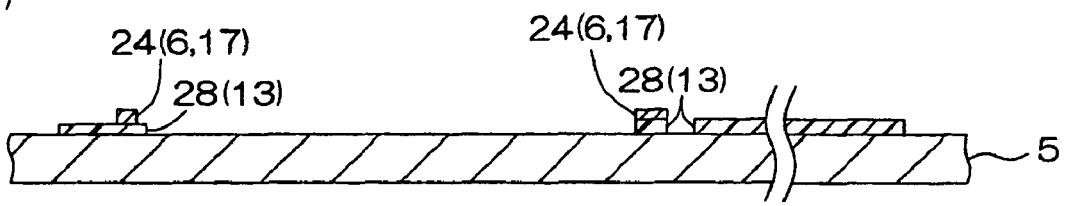
(c)
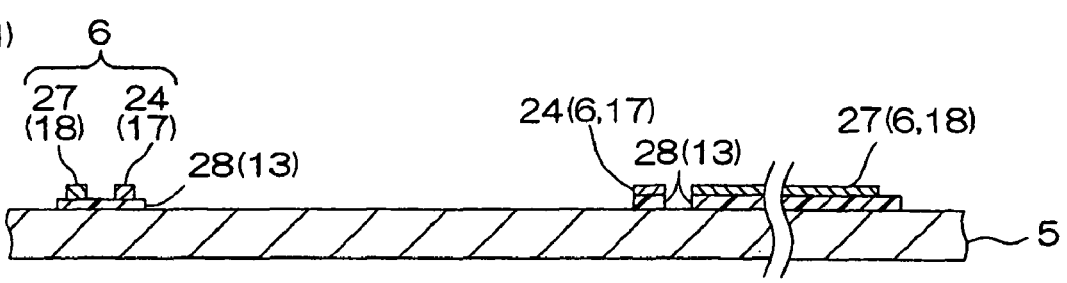
(d)
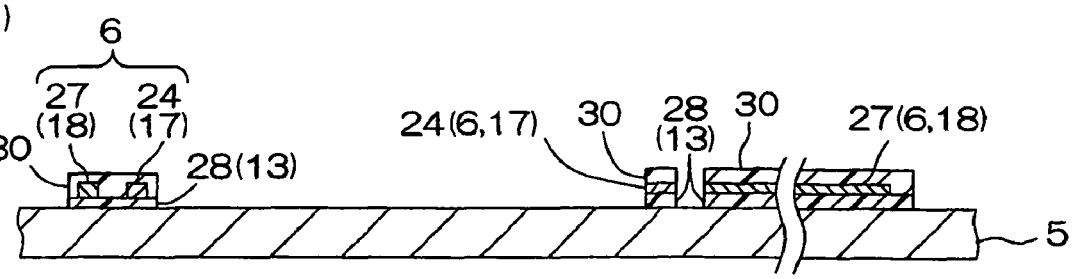
(e)
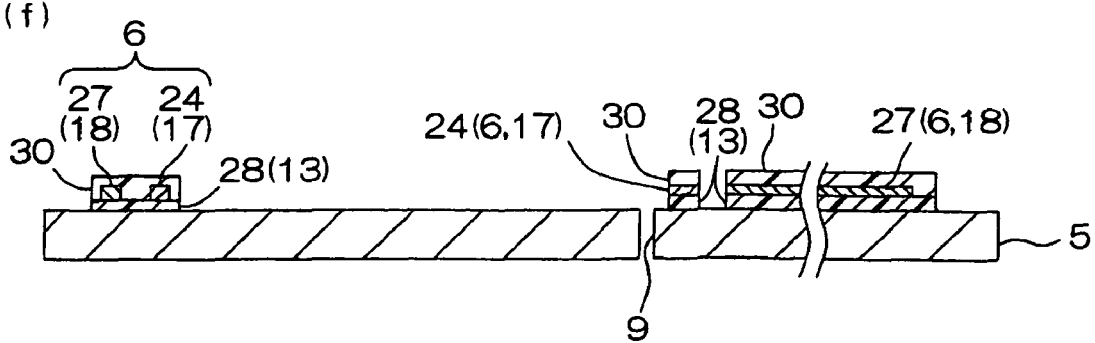
(f)

FIG.14
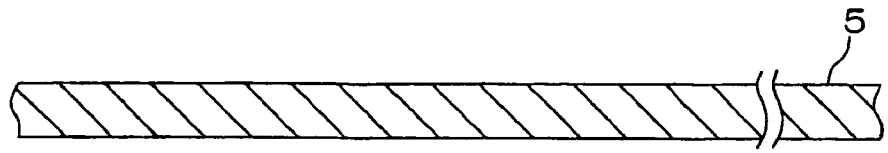
(a)
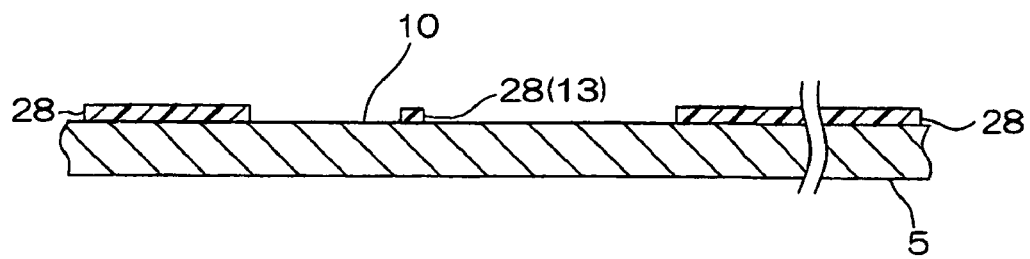
(b)
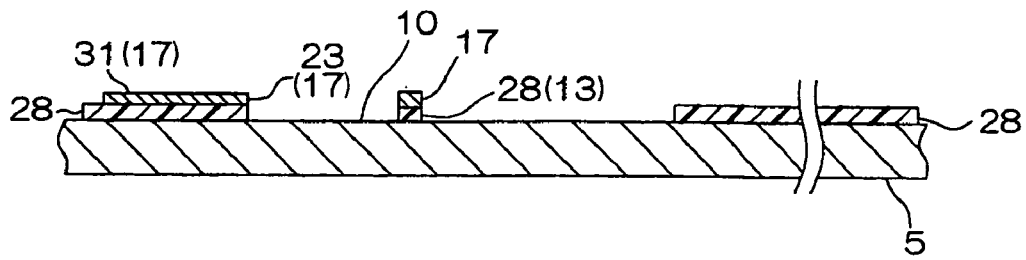
(c)
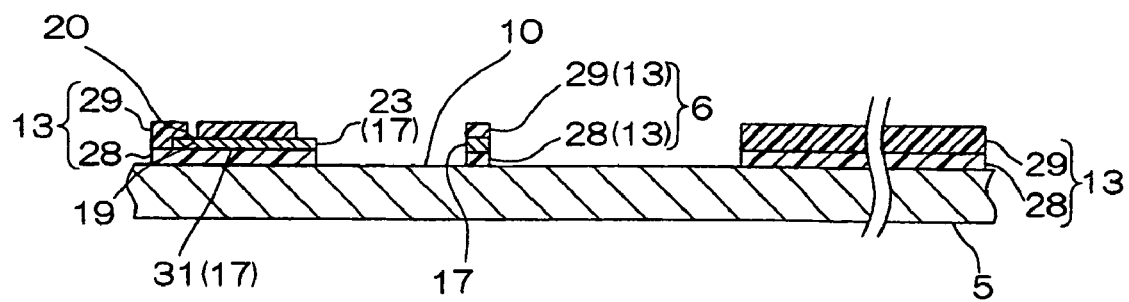
(d)
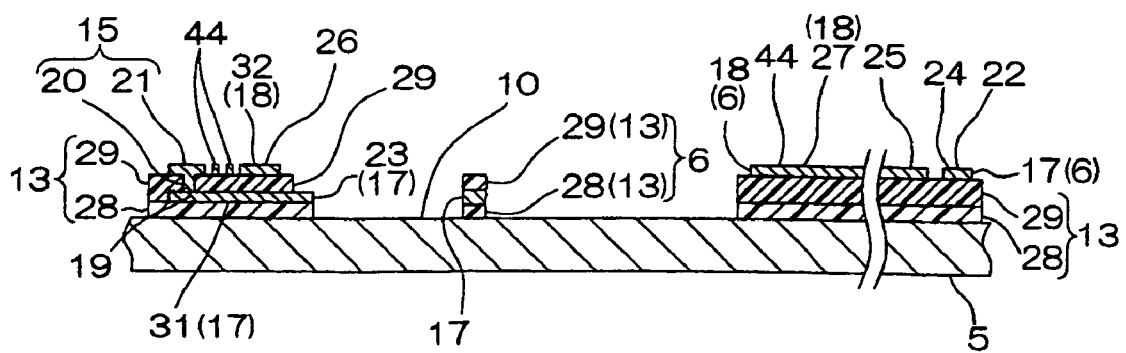
(e)

FIG.15
(f)
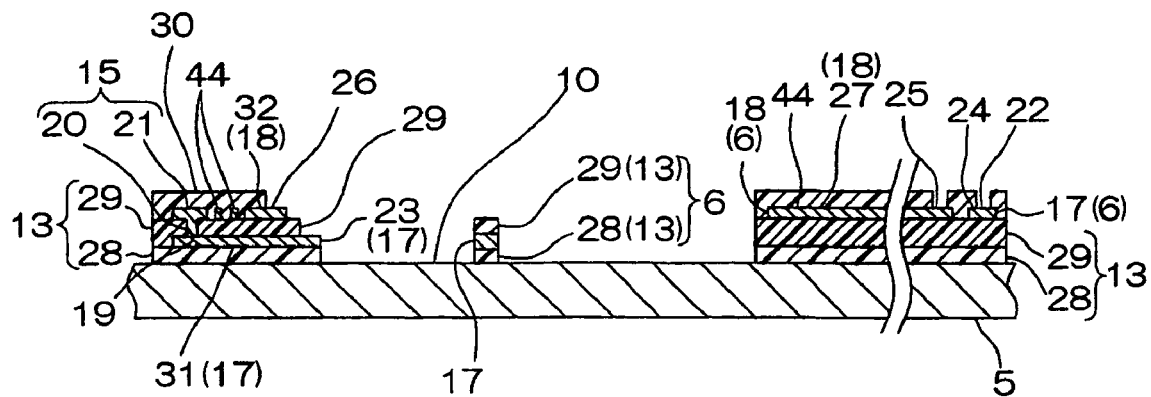
(g)
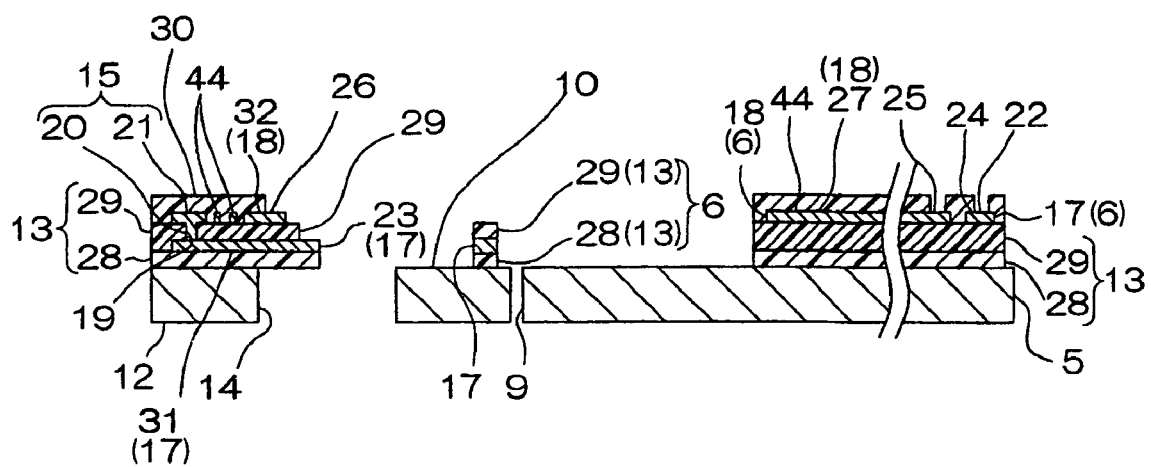
(h)
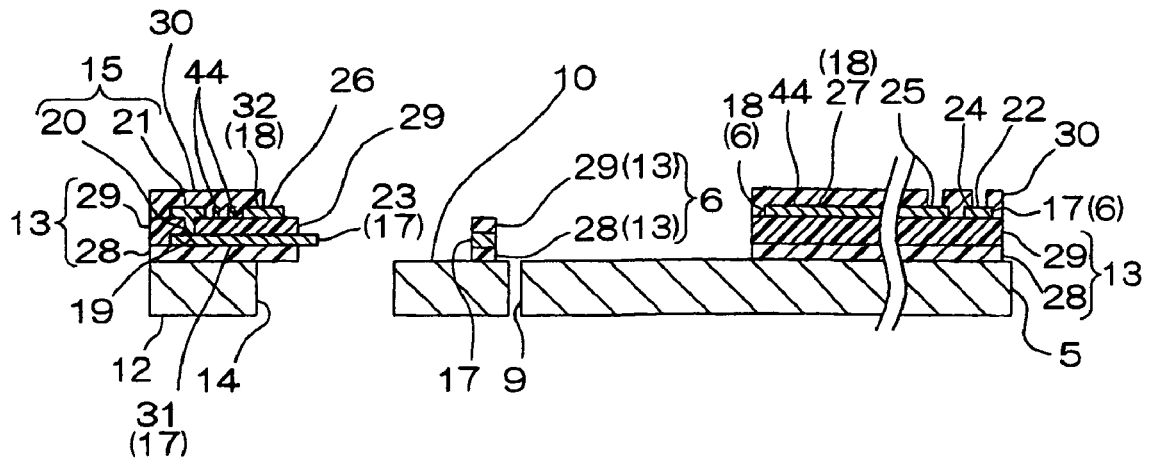

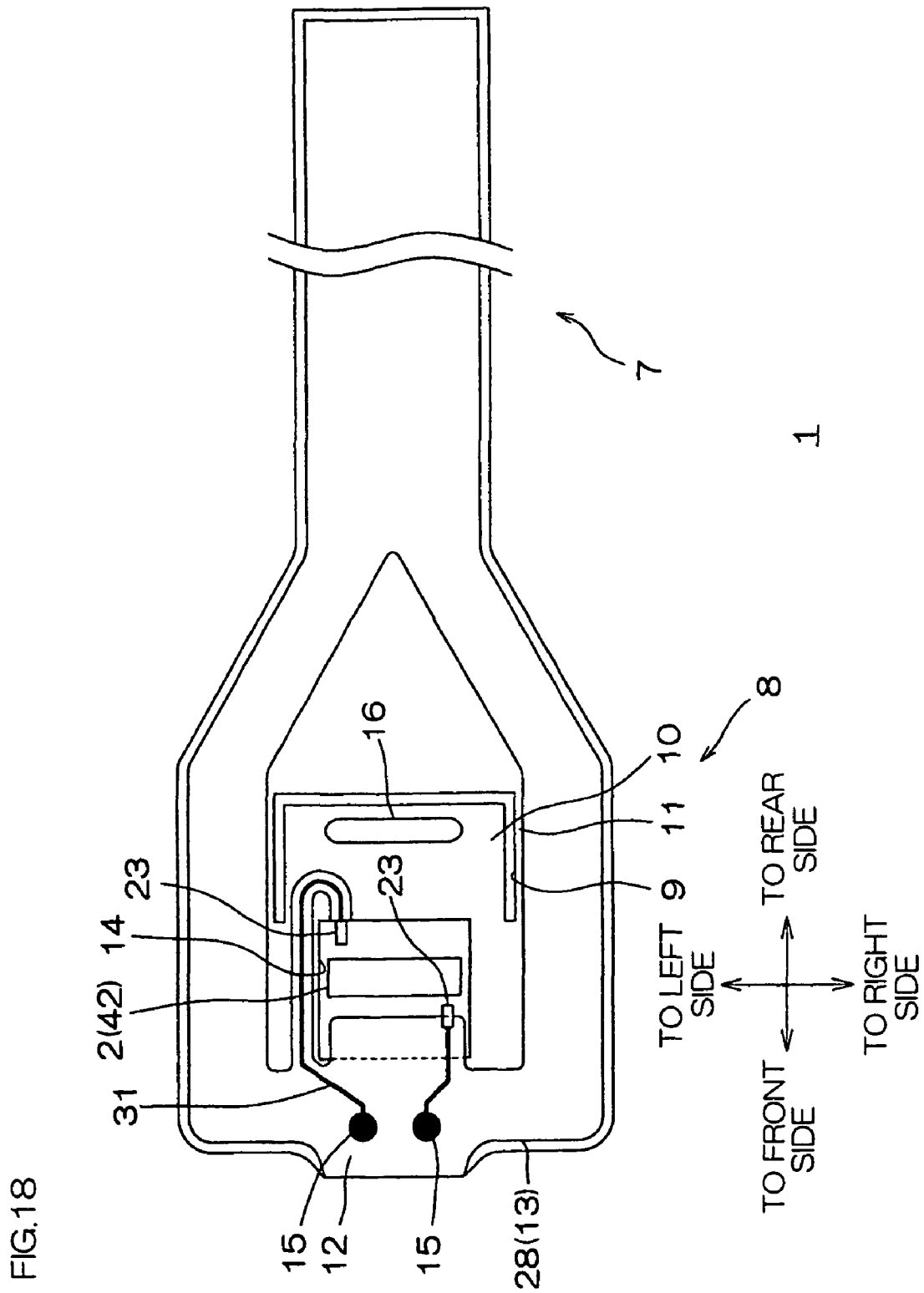

SUSPENSION BOARD WITH CIRCUIT AND PRODUCING METHOD THEREOF

CROSS-REFERENCE TO RELATED APPLICATION

The present application claims the benefit of U.S. Provisional Application No. 61/344,832, filed on Oct. 20, 2010, and also claims priority from Japanese Applications Nos. 2010-229341 filed on Oct. 12, 2010 and 2011-159688 filed on Jul. 21, 2011, the contents of which are herein incorporated by reference in their entirety.

BACKGROUND OF THE INVENTION

1. Field of the Invention

The present invention relates to a suspension board with circuit and a producing method thereof, and particularly to a suspension board with circuit used in a hard disk drive and a producing method thereof.

2. Description of the Related Art

A suspension board with circuit includes a metal supporting board, an insulating base layer formed thereon, and a conductive pattern formed thereon and having head-side terminals for connecting to a magnetic head. In the suspension board with circuit, the magnetic head is mounted on the metal supporting board and connected to a head-side terminal portion to allow the suspension board with circuit to be used in a hard disk drive.

In recent years, it has been proposed that, on such a suspension board with circuit, various electronic elements, specifically a light emitting element for, e.g., improving a recording density according to an optically assisted method, a testing element for testing, e.g., the positional precision of a magnetic head, and the like are mounted.

For example, a suspension board with circuit has been proposed which includes a metal supporting board, an insulating base layer laminated thereon, a conductive pattern laminated thereon, a magnetic head connected to the conductive pattern, and a light emitting element connected to the conductive pattern via an optical waveguide (see, e.g., Japanese Unexamined Patent No. 2010-118096).

In the suspension board with circuit proposed in Japanese Unexamined Patent No. 2010-118096, terminal portions (a magnetic-head-side connection terminal portion and a light-emitting-element terminal portion) of the conductive pattern are formed on the insulating based layer, and the magnetic head and the light emitting element are connected to the terminals portions.

SUMMARY OF THE INVENTION

However, in the suspension board with circuit proposed in Japanese Unexamined Patent No. 2010-118096, the magnetic-head-side connection terminal portion and the light-emitting-element terminal portion are each formed on the same insulating base layer. Therefore, on such an insulating base layer, the magnetic-head-side connection terminal portion and the light-emitting-element terminal portion need to be formed at a high density. This results in the problem that a short circuit is likely to occur therebetween.

On the other hand, if the short circuit is to be prevented, it is necessary to ensure a wide space where the magnetic-head-side connection terminal portion and the light-emitting-element terminal portion are to be disposed over such an insulating base layer. This results in the problem that it is impossible to achieve compactization of the suspension board with circuit on which the insulating base layer is formed.

It is therefore an object of the present invention to provide a suspension board with circuit in which the placement density of a first connecting portion and a second connecting portion can be reduced, while the flexibility of design of the first connecting portion and the second connecting portion can be increased, and a producing method thereof.

A suspension board with circuit of the present invention includes a metal supporting board, an insulating layer formed on the metal supporting board, and a conductive layer formed on the insulating layer, wherein the insulating layer includes a first insulating layer and a second insulating layer formed on the first insulating layer, the conductive layer includes a first conductive pattern and a second conductive pattern, the first conductive pattern includes a first connecting portion formed on the first insulating layer and under the second insulating layer and a first terminal formed so as to be continued to the first connecting portion, the second conductive pattern includes a second connecting portion formed on the second insulating layer and a second terminal formed so as to be continued to the second connecting portion, the suspension board with circuit is formed with an opening extending through the suspension board with circuit in a thickness direction thereof, and a slider on which an electronic element and a magnetic head are provided is provided such that the electronic element is inserted in the opening to be electrically connected to the first terminal and the magnetic head is electrically connected to the second terminal.

In the suspension board with circuit of the present invention, it is preferable that the first conductive pattern includes a first wire electrically connected to the first connecting portion, the second conductive pattern includes a second wire electrically connected to the second connecting portion, and the first wire and the second wire are formed on the first insulating layer or, alternatively, the first wire and the second wire are formed on the second insulating layer.

Also, in the suspension board with circuit of the present invention, it is preferable that a third insulating layer is formed on the second connecting portion, the second terminal is formed on the second insulating layer so as to be exposed from the third insulating layer, and the first terminal is formed in the opening so as to be exposed from the first insulating layer and the second insulating layer.

Also, in the suspension board with circuit of the present invention, it is preferable that at least a pair of the first terminals are provided so as to face the opening and, in addition, the at least one pair of first terminals are disposed such that the opening is interposed therebetween.

Also, in the suspension board with circuit of the present invention, it is preferable that the electronic element is a light emitting element, and the slider includes an optical waveguide and a near-field light generating member.

Also, in the suspension board with circuit of the present invention, it is preferable that the electronic element is a testing element.

A method of producing a suspension board with circuit of the present invention includes preparing a metal supporting board, forming a first insulating layer on the metal supporting board, forming a first conductive pattern including a first connecting portion formed on the first insulating layer and a first terminal portion continued to the first connecting portion, forming a second insulating layer on the first connecting portion, forming a second conductive pattern including a second connecting portion formed on the second insulating layer and a second terminal continued to the second connecting portion, forming the suspension board with circuit with an opening extending through the suspension board with circuit in a thickness direction thereof, and providing, on the suspension board with circuit, a slider on which an electronic element and a magnetic head are provided such that the electronic element is inserted in the opening to be electrically connected to the first terminal and the magnetic head is electrically connected to the second terminal.

In the producing method of the suspension board with circuit of the present invention and the suspension board with circuit obtained thereby, the first connecting portion and the second connecting portion are formed on the first insulating layer and the second insulating layer, respectively.

This can achieve higher flexibility in designing a layout of the first connecting portion and the second connecting portion and also allow the first terminal and the second terminal respectively connected thereto to be formed at a placement density which does not cause a short circuit.

As a result, it is possible to improve the reliability of connection between the first terminal and the second terminal, while achieving compactization.

BRIEF DESCRIPTION OF THE DRAWINGS

FIG. 5 is a process view for illustrating a producing method of the suspension board with circuit shown in FIG. 1, which corresponds to the cross-sectional view of FIG. 2, (a) showing the step of preparing a metal supporting board, (b) showing the step of forming a first insulating base layer, (c) showing the step of forming first conductive patterns, (d) showing the step of forming a second insulating base layer, (e) showing the step of forming second conductive patterns, (f) showing the step of forming an insulating cover layer, and (g) showing the step of forming an opening and a slit;

FIG. 6 is a process view for illustrating a producing method of the suspension board with circuit shown in FIG. 1, which corresponds to the cross-sectional view of FIG. 3, (a) showing the step of preparing the metal supporting board, (b) showing the step of forming the first insulating base layer, (c) showing the step of forming the first conductive patterns, (d) showing the step of forming the second conductive patterns, (e) showing the step of forming the insulating cover layer, and (f) showing the step of forming the opening and the slit;

FIG. 14 is a process view for illustrating a producing method of the suspension board with circuit shown in FIG. 10, which corresponds to the cross-sectional view of FIG. 11, (a) showing the step of preparing a metal supporting board, (b) showing the step of forming a first insulating base layer, (c) showing the step of forming element-side connecting portions and element-side terminals, (d) showing the step of forming the second insulating base layer, and (e) showing the step of forming the first conductive patterns and the second conductive patterns;

FIG. 15 is a process view for illustrating the producing method of the suspension board with circuit shown in FIG. 10, which is subsequent to FIG. 14 and corresponds to the cross-sectional view of FIG. 11, (f) showing the step of forming the insulating cover layer, (g) showing the step of forming an opening and a slit, and (h) showing the step of partially removing the first insulating base layer;

FIG. 18 is a plan view of the suspension board with circuit shown in FIG. 16 when a second insulating base layer, first conductive patterns and second conductive patterns each formed thereon, and an insulating cover layer are omitted therefrom.

DETAILED DESCRIPTION OF THE INVENTION

Figure 1:
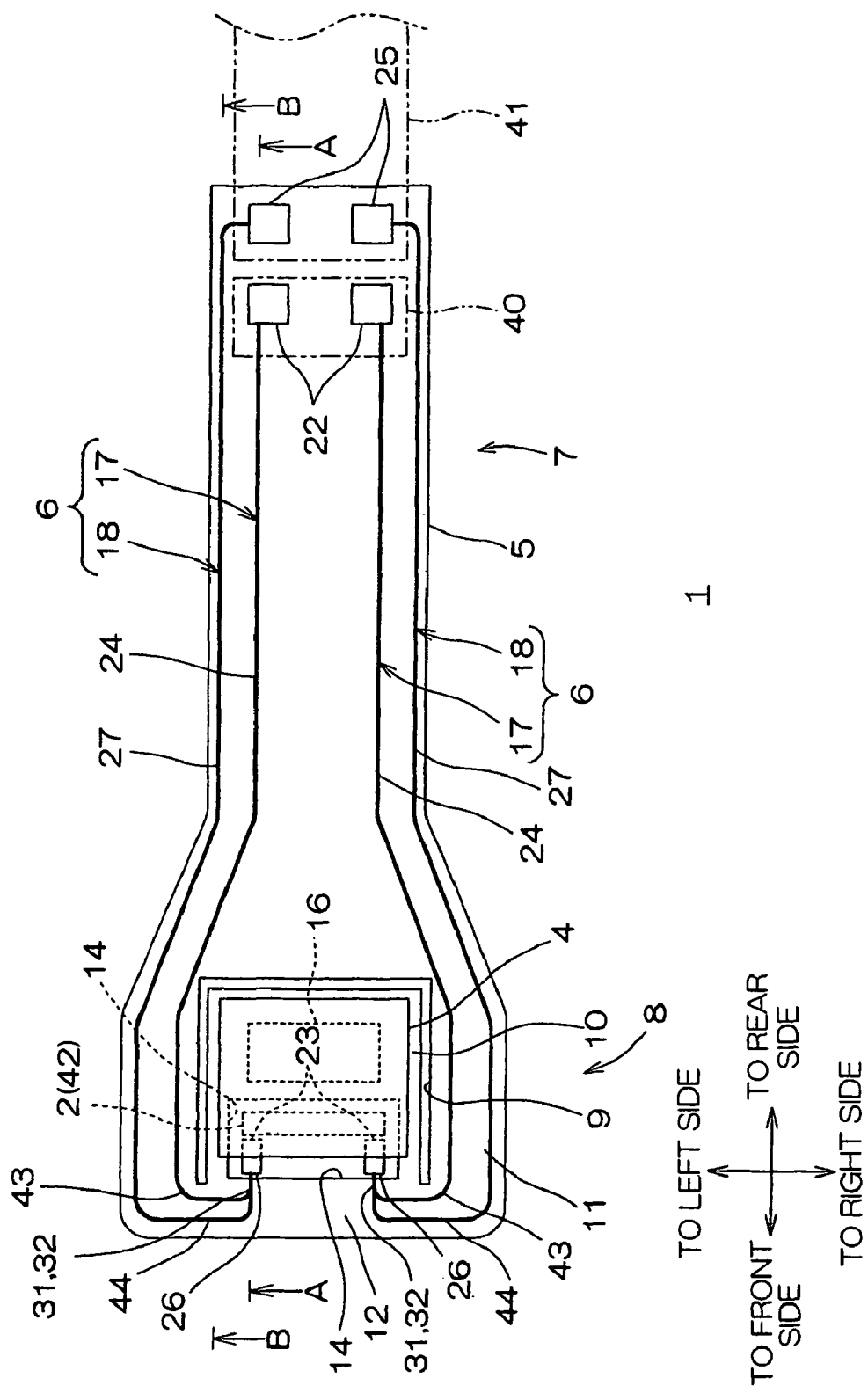
FIG. 1 is a plan view of an embodiment (a form in which element wire supply-side portions and head wire external portions are formed on a first insulating base layer) of a suspension board with circuit of the present invention.
Figure 2:
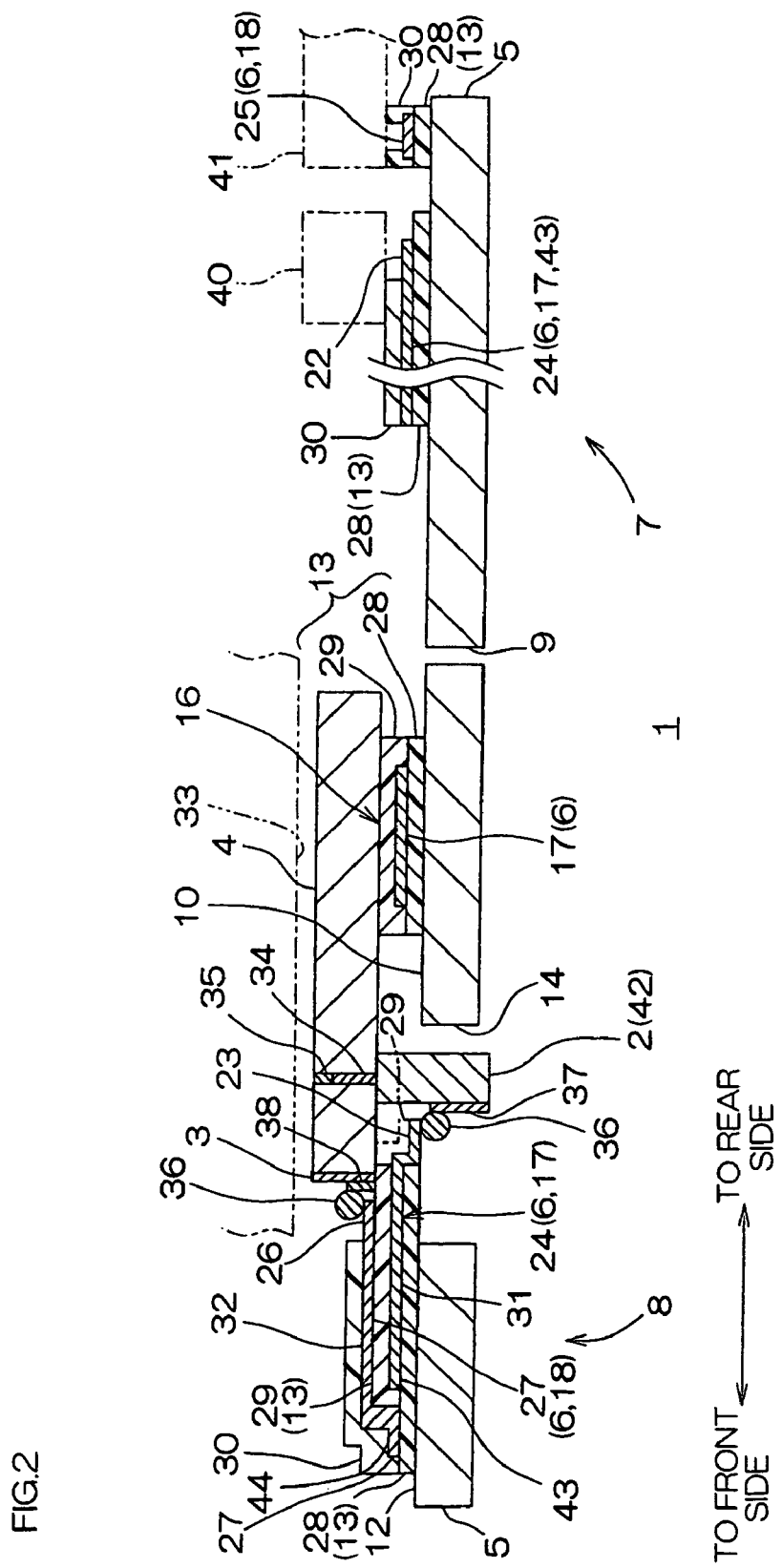
FIG. 2 is a cross-sectional view of the suspension board with circuit shown in FIG. 1 along the line A-A.
Figure 3:
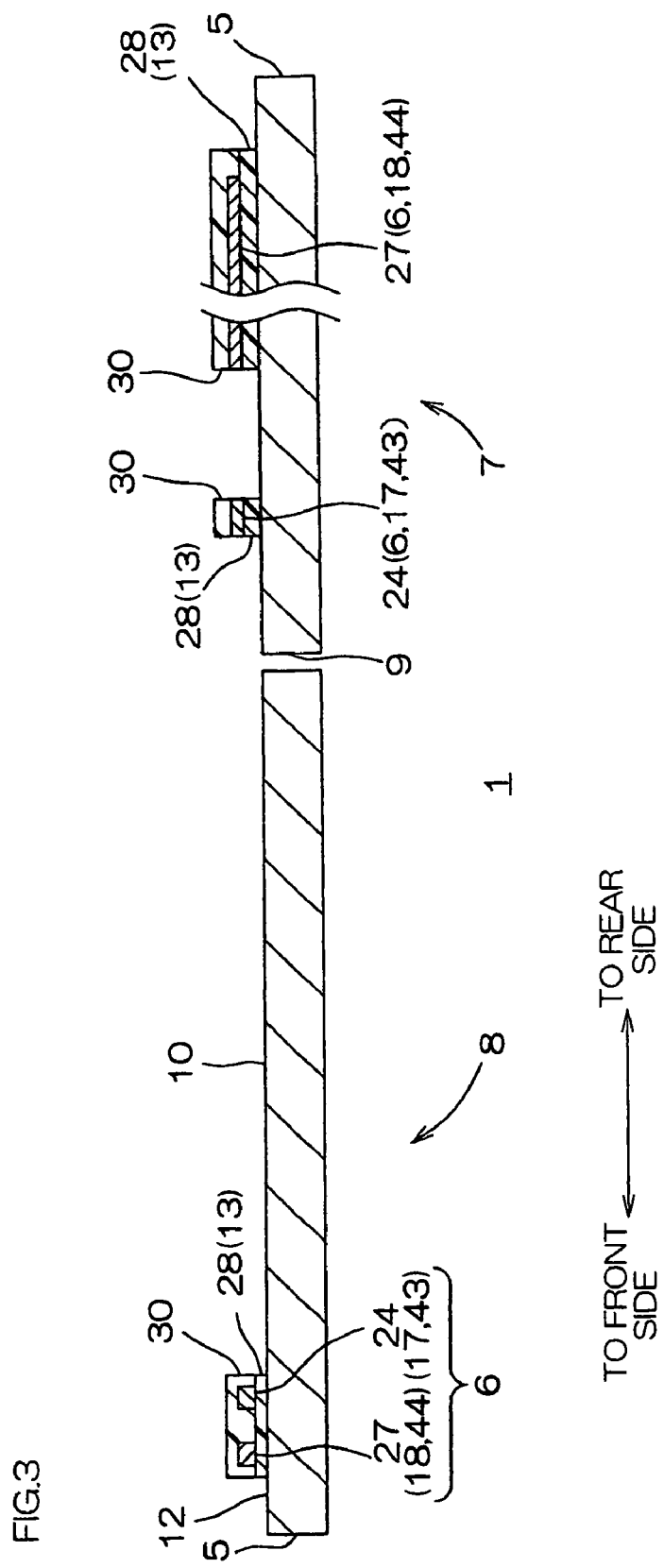
FIG. 3 is a cross-sectional view of the suspension board with circuit shown in FIG. 1 along the line B-B.
Figure 4:
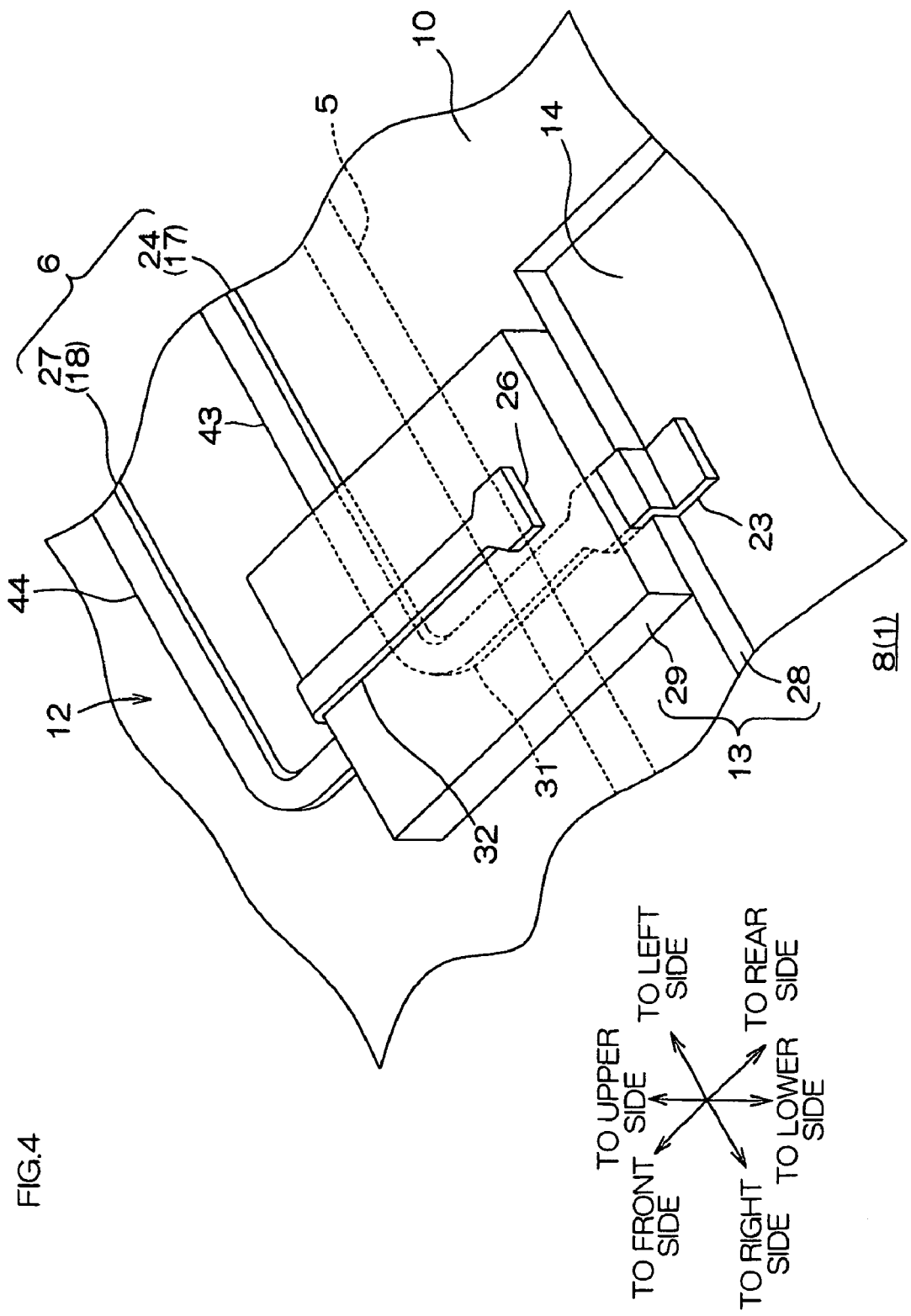
FIG. 4 is an enlarged perspective view of an element-side terminal and a head-side terminal of the suspension board with circuit shown in FIG. 1.

FIG. 1 is a plan view of an embodiment (a form in which element wire supply-side portions and head wire external portions are formed on a first insulating base layer) of a suspension board with circuit of the present invention. FIGS. 2 and 3 are cross-sectional views of the suspension board with circuit shown in FIG. 1 along the respective lines A-A and B-B. FIG. 4 is an enlarged perspective view of an element-side terminal and a head-side terminal of the suspension board with circuit shown in FIG. 1. FIGS. 5 and 6 are process views for illustrating a producing method of the suspension board with circuit shown in FIG. 1.

Note that, in FIG. 1, an insulating base layer 13 and an insulating cover layer 30 are omitted for clear illustration of relative positioning of a conductive layer 6 described later. Also, in FIG. 4, the insulating cover layer 30 is omitted for clear illustration of relative positioning of the conductive layer 6.

In FIGS. 1 and 2, the suspension board with circuit 1 mounts thereon a slider 4 on which a light emitting element 2 as an electronic element and a magnetic head 3 are provided and is used in a hard disk drive employing an optically assisted method.

In the suspension board with circuit 1, the conductive layer 6 is supported on a metal supporting board 5.

The metal supporting board 5 is formed in a flat belt shape extending in a longitudinal direction. The metal supporting board 5 integrally includes a wiring portion 7 disposed on one longitudinal side (hereinafter referred to as a rear side) and a mounting portion 8 disposed on the other longitudinal side (hereinafter referred to as a front side) of the wiring portion 7.

The wiring portion 7 is formed in a generally rectangular plan view shape extending in a front-rear direction.

The mounting portion 8 is formed continuously from the front end edge of the wiring portion 7 into a generally rectangular plan view shape which protrudes on both outsides of the wiring portion 7 in a widthwise direction (direction perpendicular to the front-rear direction, which is the left-right direction shown in FIG. 1).

The mounting portion 8 has a slit 9 formed in a generally U-shaped shape which opens toward the front side when viewed in plan view. The mounting portion 8 is partitioned into a tongue portion 10 widthwise interposed in the slit 9, outrigger portions 11 disposed on both outsides of the slit 9 in the widthwise direction, and a wire turn-back portion 12 disposed on the front side of the tongue portion 10 and the outrigger portions 11.

The tongue portion 10 is formed in a generally rectangular tongue shape when viewed in plan view. The tongue portion 10 is formed with a pedestal 16 and an opening 14.

To support the slider 4, the pedestal 16 is provided at the middle in each of the widthwise direction and the front-rear direction of the tongue portion 10 and formed in a generally rectangular plan view shape which is elongated in the widthwise direction.

The opening 14 is provided at the widthwise middle of the front portion of the tongue portion 10, disposed to be spaced apart from the front side of the pedestal 16, and formed so as to extend through the suspension board with circuit 1 in a vertical direction (thickness direction). The opening 14 is also formed in a generally rectangular plan view shape which is elongated in the widthwise direction. Note that the opening 14 is formed into a size larger than that of the light emitting element 2 when viewed in plan view to allow the light emitting element 2 to be inserted therethrough.

The conductive layer 6 includes first conductive patterns 17 and second conductive patterns 18.

The first conductive patterns 17 and the second conductive patterns 18 are formed to extend continuously over the wiring portion 7 and the mounting portion 8.

The plurality of (two) first conductive patterns 17 electrically connect the light emitting element 2 and a power source 40 (imaginary line) and are formed to be widthwise spaced apart from each other over the wiring portion 7 and the mounting portion 8.

The first conductive patterns 17 integrally include supply-side terminals 22 for connecting to the power source 40, element-side terminals 23 (broken lines) as first terminals for connecting to the light emitting element 2, and element wires 24 electrically connecting the supply-side terminals 22 and the element-side terminals 23.

The plurality of (two) supply-side terminals 22 are disposed on the rear end portion of the wiring portion 7 in widthwise spaced-apart relation.

The plurality of (two) element-side terminals 23 are disposed on the front end portion of the mounting portion 8, specifically in the opening 14 of the suspension board with circuit 1, in widthwise spaced-apart relation.

The plurality of (two) element wires 24 are formed over the wiring portion 7 and the mounting portion 8 so as to extend along the peripheral end edges thereof in widthwise spaced-apart relation. Specifically, each of the element wires 24 is formed so as to linearly extend over the wiring portion 7 from the supply-side terminal 22 toward the front side. Also, each of the element wires 24 is formed to extend over the outrigger portion 11 of the mounting portion 8 along the peripheral end portion thereof toward the front side to be successively turned widthwise inward and then rearward at the wire turn-back portion 12 and reach the element-side terminal 23.

The second conductive patterns 18 electrically connect a read/write board 41 (imaginary line) and the magnetic head 3 and are disposed outside the first conductive patterns 17 to be spaced apart therefrom in facing relation.

The second conductive patterns 18 integrally include external terminals 25 for connecting to the read/write board 41, head-side terminals 26 each as a second terminal for connecting to the magnetic head 3, and head wires 27 for electrically connecting the external terminals 25 and the head-side terminals 26.

The plurality of (two) external terminals 25 are disposed on the rear end portion of the wiring portion 7 to be widthwise spaced apart from each other, more specifically disposed on the rear side of the supply-side terminals 22 to be spaced apart therefrom.

The plurality of (two) head-side terminals 26 are disposed on the front end portion of the mounting portion 8, specifically in the opening 14 of the suspension board with circuit 1, to be widthwise spaced apart from each other.

The head wires 27 are formed over the wiring portion 7 and the mounting portion 8 so as to extend along the peripheral end edges thereof and disposed outside the element wires 24 to be spaced apart therefrom. The plurality of (two) head wires 27 are formed to be widthwise spaced apart from each other. Specifically, each of the head wires 27 is formed so as to linearly extend over the wiring portion 7 from the external terminal 25 toward the front side. Also, each of the head wires 27 is formed to extend over the outrigger portion 11 of the mounting portion 8 between the peripheral end edge thereof and the element-side wire 24 toward the front side to be successively turned widthwise inward and rearward at the wire turn-back portion 12 and reach the head-side terminal 26.

Note that, as described later in detail, the front end portions (head-side connecting portions 32) of the head wires 27 connected to the head-side terminals 26 are disposed to vertically face the front end portions (element-side connecting portions 31) of the element wires 24 connected to the element-side terminals 23.

As shown in FIGS. 2 and 3, in the wiring portion 7 and the mounting portion 8, the suspension board with circuit 1 includes the metal supporting board 5, the insulating base layer 13 as an insulating layer formed on the metal supporting board 5, the conductive layer 6 formed on the insulating base layer 13, and the insulating cover layer 30 as a third insulating layer formed on the conductive layer 6.

The metal supporting board 5 is formed of a metal material such as, e.g., stainless steel, a 42-alloy, aluminum, a copper-beryllium alloy, or phosphor bronze. Preferably, the metal supporting board 5 is formed of stainless steel. The thickness of the metal supporting board 5 is in a range of, e.g., 15 to 50 μm, or preferably 15 to 30 μm.

The insulating base layer 13 is formed on the metal supporting board 5 into a pattern corresponding to a portion where the conductive layer 6 is formed.

More specifically, the insulating base layer 13 includes a first insulating base layer 28 as a first insulating layer and a second insulating base layer 29 as a second insulating layer formed on the first insulating base layer 28.

The first insulating base layer 28 is formed on the upper surface of the metal supporting board 5.

The second insulating base layer 29 is formed on the upper surface of the first insulating base layer 28.

Each of the first insulating base layer 28 and the second insulating base layer 29 is formed of an insulating material such as a synthetic resin. Examples of the synthetic resin include a polyimide resin, a polyamideimide resin, an acrylic resin, a polyether nitrile resin, a polyether sulfone resin, a polyethylene terephthalate resin, a polyethylene naphthalate resin, and a polyvinyl chloride resin. Preferably, each of the first insulating base layer 28 and the second insulating base layer 29 is formed of a polyimide resin.

The thickness of each of the first insulating base layer 28 and the second insulating base layer 29 is in a range of, e.g., 1 to 35 μm, or preferably 3 to 15 μm.

The conductive layer 6 is formed as a wired circuit pattern including the first conductive patterns 17 and the second conductive patterns 18 on the upper surface of the insulating base layer 13, as described above.

The thickness of the conductive layer 6 is in a range of, e.g., 3 to 50 μm, or preferably 5 to 20 μm. The widths of the element wires 24 and the head wires 27 are in a range of, e.g., 5 to 200 μm, or preferably 8 to 100 μm. The widths of the supply-side terminals 22, the element-side terminals 23, the external terminals 25, and the head-side terminals 26 are in a range of, e.g., 15 to 1000 μm, or preferably 20 to 800 μm.

The insulating cover layer 30 is formed on the insulating base layer 13 into a pattern covering the element wires 24 and the head wires 27 and exposing the supply-side terminals 22, the element-side terminals 23, the external terminals 25, and the head-side terminals 26.

The insulating cover layer 30 is formed of the same insulating material as the insulating material forming the first insulating base layer 28 and the second insulating base layer 29. The thickness of the insulating cover layer 30 is in a range of, e.g., 1 to 40 μm, or preferably 3 to 10 μm.

Next, the element-side terminals 23 and the head-side terminals 26 of the suspension board with circuit 1 are described in detail with reference to FIGS. 1 to 4.

Note that, in the following description, the element-side terminal 23 and the head-side terminal 26 on one widthwise side (left side) are described by way of example. However, the element-side terminal 23 and the head-side terminal 26 on the other widthwise side (right side) are the same as those on one widthwise side so that a description thereof is omitted.

In FIGS. 2 and 4, in the tongue portion 10, the first insulating base layer 28 is formed so as to protrude from the front end edge of the opening 14 of the suspension board with circuit 1 toward the inside of the opening 14.

The rear end portion of the first insulating base layer 28 is formed to widthwise traverse the opening 14 of the suspension board with circuit 1 when projected in the thickness direction.

Of the element wire 24, the portion continued to the element-side terminal 23 after turned rearward at the wire turn-back portion 12 is used as the element-side connecting portion 31 as a first connecting portion, while the portion of the element wire 24 other than the element-side connecting portion 31 is used as an element wire supply-side portion 43 as a first wire.

The element-side connecting portion 31 is formed in a rearwardly extending linear shape on the upper surface of the first insulating base layer 28. The rear end portion of the element-side connecting portion 31 protrudes widthwise outwardly.

The element wire supply-side portion 43 is formed on the upper surface of the first insulating base layer 28 and electrically connected to the element-side connecting portion 31.

The element-side terminal 23 has a generally L-shaped cross-sectional shape. Specifically, the element-side terminal 23 is formed to extend downward from the front end of the element-side connecting portion 31 along the rear end surface of the first insulating base layer 28 and then be curved rearward.

The element-side terminal 23 is provided so as to face the inner surface of the opening 14 of the suspension board with circuit 1. Specifically, the element-side terminal 23 is exposed from the rear end edge of the first insulating base layer 28 in the opening 14.

The lower surface of the element-side terminal 23 is formed to be flush with the lower surface of the first insulating base layer 28 in the thickness direction.

On the element-side connecting portion 31, the second insulating base layer 29 is formed.

The second insulating base layer 29 is formed in a generally rectangular plan view shape so as to cover the upper surface of the first insulating base layer 28 exposed from the element-side connecting portion 31 and the side surfaces and upper surface of the element-side connecting portion 31.

The rear end edge of the second insulating base layer 29 at the wire turn-back portion 12 is formed at the same position as that of the rear end edge of the first insulating base layer 28 when projected in the thickness direction.

As a result, in the opening 14 of the suspension board with circuit 1, the element-side terminal 23 is exposed from the rear end edge of the second insulating base layer 29.

On the second insulating base layer 29, the head wire 27 and the head-side terminal 26 are formed.

Of the head wire 27, the portion continued to the head-side terminal 26 after turned rearward at the wire turn-back portion 12 is used as the head-side connecting portion 32 as a second connecting portion, while the portion of the head wire 27 other than the head-side connecting portion 32 is used as a head wire external portion 44 as a second wire.

That is, the head wire 27 that has been turned rearward at the wire turn-back portion 12 is curved upward along the front end surface of the second insulating base layer 29. Subsequently, the portion of the head wire 27 extending along the upper surface of the second insulating base layer 29 before being curved rearward is used as the head wire external portion 44, while the portion of the head wire 27 provided on the upper surface of the second insulating base layer 29 after being curved rearward is used as the head-side connecting portion 32.

The head wire external portion 44 is formed on the upper surface of the first insulating base layer 28 and the front end surface of the second insulating base layer 29 and is electrically connected to the head-side connecting portion 32.

The head-side connecting portion 32 is linearly formed on the upper surface of the second insulating base layer 29 to extend from the front end portion of the second insulating base layer 29 over the middle in the front-rear direction.

The head-side connecting portion 32 is disposed to vertically face the element-side connecting portion 31 with the second insulating base layer 29 interposed therebetween. Specifically, the head-side connecting portion 32 overlaps the element-side connecting portion 31 at the middle in the front-rear direction of the second insulating base layer 29 when projected in the thickness direction.

The head-side terminal 26 is formed on the upper surface of the second insulating base layer 29 into a rectangular plan view shape which widthwise outwardly protrudes from the rear end edge of the head-side connecting portion 32. The head-side terminal 26 is formed at a position different from that of the element-side terminal 23 in the thickness direction, i.e., over the element-side terminal 23 when projected in the front-rear direction. Specifically, the head-side terminal 26 is formed over the element-side terminal 23 with a spacing corresponding to the thickness of the second insulating base layer 29 interposed therebetween.

Note that the head-side terminal 26 is disposed to be spaced apart from the rear end edge of the second insulating base layer 29 on the front side thereof.

On the head-side connecting portion 32, the insulating cover layer 30 is formed.

The insulating cover layer 30 is formed so as to cover the upper surface of the second insulating base layer 29 exposed from the head-side connecting portion 32 and the side surfaces and upper surface of the head-side connecting portion 32.

The rear end edge of the insulating cover layer 30 is formed at the same position as that of the front end surface of the opening 14 of the suspension board with circuit 1 when projected in the thickness direction. In this manner, the insulating cover layer 30 exposes the head-side terminal 26.

The pedestal 16 is formed of the first insulating base layer 28 described above, the first conductive patterns 17 formed thereon, and the second insulating base layer 29 formed thereon.

The first conductive pattern 17 of the pedestal 16 is included in the second insulating base layer 29 when viewed in plan view.

The peripheral end edge of the second insulating base layer 29 is formed at the same position as that of the peripheral end edge of the first insulating base layer 28 when viewed in plan view.

Next, the slider 4 mounted on the suspension board with circuit 1 is described.

The slider 4 is mounted on the tongue portion 10 so as to float over a magnetic disk 33 shown by the imaginary line of FIG. 2 and travel relative to the magnetic disk 33, while holding a minute gap therebetween. Specifically, in the tongue portion 10, the slider 4 is supported by the pedestal 16 from thereunder.

On the slider 4, the magnetic head 3, the light emitting element 2, an optical waveguide 34, and a near-field light generating member 35 are provided.

The magnetic head 3 is mounted on the front end portion of the slider 4 to face the magnetic disk 33 and provided to be able to perform reading and writing to the magnetic disk 33.

The front end surface of the lower portion of the magnetic head 3 is provided with second connection terminals 38, and the magnetic head 3 is electrically connected to the head-side terminal 26 via solder balls 36 provided at the second connection terminals 38.

The light emitting element 2 is a light source which, e.g., converts electric energy to optical energy and emits high-energy light from an emission hole toward the optical waveguide 34. The light emitting element 2 is mounted under the slider 4. Specifically, the light emitting element 2 is mounted on the lower surface of the slider 4 such that the emission hole faces the optical waveguide 34.

The light emitting element 2 is inserted in the opening 14 of the suspension board with circuit 1. More specifically, the front end surface of the lower portion of the light emitting element 2 is provided with first connection terminals 37, and the light emitting element 2 is inserted in the opening 14 of the suspension board with circuit 1 so as to be electrically connected to the element-side terminals 23 via the solder balls 36 provided at the first connection terminals 37.

The optical waveguide 34 is provided to cause the light emitted from the light emitting element 2 to be incident on the near-field light generating member 35 and provided to be buried in the lower surface of the slider 4 and extend therefrom to a middle point in the thickness direction. The optical waveguide 34 is formed above the light emitting element 2 so as to extend along the vertical direction. On the upper end of the optical waveguide 34, the near-field light generating member 35 is provided.

The near-field light generating member 35 is provided to generate near-field light from the incident light from the optical waveguide 34 and irradiate the magnetic disk 33 with the near-field light to heat an minute region of the magnetic disk 33. Note that the near-field light generating member 35 is formed of a metal scatterer, an opening, or the like, and a known near-field light generating device described in, e.g., Japanese Unexamined Patent No. 2007-280572, 2007-052918, 2007-207349, 2008-130106, or the like is used.

Note that the front end portion of the slider 4 is placed on the upper surface of the rear end portion of the second insulating base layer 29. On the other hand, the rear end portion of the slider 4 is fixed via an adhesive (not shown) to the upper surface of the pedestal 16.

FIGS. 5 and 6 are process views for illustrating a producing method of the suspension board with circuit shown in FIG. 1.

Next, a producing method of the suspension board with circuit 1 is described with reference to FIGS. 5 and 6.

In the method, each of the steps (FIGS. 5(*a*) to 5(*g*) and 6(*a*) to 6(*f*)) is performed by, e.g., a roll-to-roll method which conveys the elongated metal supporting board 5 using a feed-out roll (not shown) and a wind-up roll (not shown).

First, in the method, as shown in FIGS. 5(*a*) and 6(*a*), the metal supporting board 5 is prepared.

Next, as shown in FIGS. 5(*b*) and 6(*b*), the first insulating base layer 28 is formed on the metal supporting board 5.

The first insulating base layer 28 is formed in the foregoing pattern by, e.g., coating a varnish of a photosensitive insulating material onto the metal supporting board 5, drying the coating, exposing it to light, developing it, and heat-curing it.

Next, as shown in FIGS. 5(*c*) and 6(*c*), the first conductive patterns 17 are formed on the metal supporting board 5 and the first insulating base layer 28 by a pattern forming method such as an additive method or a subtractive method. Note that the element-side terminals 23 are formed on the metal supporting board 5 in which the opening 14 is formed in the subsequent step (FIG. 5(*g*)).

In addition, at the same time, the first conductive patterns 17 are formed also on the first insulating base layer 28 for forming the pedestal 16.

Next, as shown in FIG. 5(*d*), the second insulating base layer 29 is formed on the first insulating base layer 28 so as to cover the element-side connecting portions 31. At the same time, the second insulating base layer 29 is formed on the first insulating base layer 28 for forming the pedestal 16 and on the first conductive patterns 17 for forming the pedestal 16.

The second insulating base layer 29 is formed in the foregoing pattern by, e.g., coating a varnish of a photosensitive insulating material onto the metal supporting board 5, the first insulating base layer 28, and the first conductive patterns 17, drying the coating, exposing it to light, developing it, and heat-curing it.

Next, as shown in FIGS. 5(e) and 6(d), the second conductive patterns 18 are formed on the first insulating base layer 28 and the second insulating base layer 29 by a pattern forming method such as an additive method or a subtractive method.

Next, as shown in FIGS. 5(f) and 6(e), the insulating cover layer 30 is formed on the first conductive patterns 17 and the second conductive patterns 18.

Specifically, the insulating cover layer 30 is formed in the foregoing pattern by coating a varnish of a photosensitive insulating material onto the metal supporting board 5, the first conductive patterns 17, the second conductive patterns 18, the first insulating base layer 28, and the second insulating base layer 29, drying the coating, exposing it to light, developing it, and heat-curing it.

Thereafter, as shown in FIGS. 5(g) and 6(f), the metal supporting board 5 is trimmed by, e.g., etching or the like, while the opening 14 and the slit 8 are formed in the metal supporting board 5.

As a result, the element-side terminals 23 curved rearward along the rear end surface of the first insulating base layer 28 are exposed in the opening 14 of the suspension board with circuit 1 and thereby formed as flying structures having the top and back surfaces thereof exposed.

Subsequently, as shown in FIG. 2, the slider 4 on which the light emitting element 2 and the magnetic head 3 each described above are provided is placed on the upper surface of the pedestal 16 via a known adhesive (not shown) such that the light emitting element 2 is inserted in the opening 14. In this manner, the slider 4 is mounted on the tongue portion 10.

In the mounting of the slider 4 onto the tongue portion 10, the second connection terminals 38 of the magnetic head 3 are electrically connected to the head-side terminals 26 via the solder balls 36, while the first connection terminals 37 of the light emitting element 2 are electrically connected to the element-side terminals 23 via the solder balls 36.

The connection between the second connection terminals 38 and the head-side terminals 26 is achieved by placing the solder balls 36 from above and melting them through heating.

The connection between the first connection terminals 37 and the element-side terminals 23 is achieved by placing the solder balls 36 from below and melting them through ultrasonic vibration, heating, or the like.

At the same time, the supply-side terminals 22 are connected to the power source 40 (imaginary line), while the external terminals 25 are connected to the read/write board 41 (imaginary line).

In this manner, the suspension board with circuit 1 is obtained.

In a hard disk drive in which such a suspension board with circuit 1 is mounted, an optically assisted method can be employed.

Specifically, in such a hard disk drive, the magnetic disk 33 travels relative to the near-field light generating member 35 and the magnetic head 3. The light emitted from the light emitting element 2 passes through the optical waveguide 34 and reaches the near-field light generating member 35, whereby near-field light is generated in the near-field light generating member 35. Then, the near-field light generated in the near-field light generating member 35 irradiates the surface of the magnetic disk 33 facing the upper side of the near-field light generating member 35. Then, through the irradiation with the near-field light from the near-field light generating member 35, the surface of the magnetic disk 33 is heated and, in this state, by irradiation with a magnetic field from the magnetic head 3, information is recorded on the magnetic disk 33. As a result, the coercive force of the magnetic disk 33 is reduced, and therefore information can be recorded at a high density on the magnetic disk 33 by the irradiation with the small magnetic field.

In the suspension board with circuit 1, the element-side connecting portions 31 and the head-side connecting portions 32 are respectively formed on the first insulating base layer 28 and the second insulating base layer 29.

This can achieve higher flexibility in designing a layout of the element-side connecting portions 31 and the head-side connecting portions 32 and also allow the element-side terminals 23 and the head-side terminals 26 respectively connected thereto to be formed at a placement density which does not cause a short circuit.

As a result, it is possible to improve the reliability of connection between the element-side terminals 23 and the head-side terminals 26, while achieving compactization.

The suspension board with circuit 1 described above can be obtained by successively forming, on the metal supporting board 5, the first insulating base layer 28, the first conductive patterns 17 including the element-side connecting portions 31, the second insulating base layer 29, and the second conductive patterns 18 including the head-side connecting portions 32.

Therefore, in the manufacturing process, it is possible to form both of the first conductive patterns 17 and the second conductive patterns 18 on the metal supporting board 5 using common equipment without vertically inverting the metal supporting board 5.

As a result, it is possible to improve the reliability of the optically assisted method, while effectively preventing damage to the first conductive pattern 17 resulting from vertical inversion of the metal supporting board.

Note that, in the embodiment described above, the light emitting element 2 is used as an electronic element in the present invention. However, it is also possible to use, e.g., a testing element 42 (see parenthesized reference numerals).

The testing element 42 is not particularly limited, and examples thereof include an element which produces an electric signal in response to vibration, pressure, or the like.

When the suspension board with circuit 1 is used in the hard disk drive, if there is roughness or disorder present in the surface of the magnetic disk 33, the slider 4 floating over and traveling relative to the magnetic disk 33, while holding a minute gap therebetween, vibrates or receives pressure.

In the suspension board with circuit 1 on which the testing element 42 is mounted, the testing element 42 senses vibration, pressure, or the like in the slider 4 and produces an electric signal.

Therefore, by detecting the electric signal produced by the testing element 42, it is possible to sense the roughness or disorder in the magnetic disk 33 and examine whether or not the magnetic disk 33 is defective.

In the embodiment described above, the element-side terminals 23 are formed as flying leads exposed from both of the first insulating base layer 28 and the second insulating base layer 29. However, it is possible to, e.g., support the element-side terminals 23 with the second insulating base layer 29 from above and expose the element-side terminals 23 only from the first insulating base layer 28, as shown by the imaginary line of FIG. 2.

In that case, on the element-side terminals 23, the second insulating base layer 29 is formed.

Preferably, the element-side terminals 23 are formed as the flying leads. This allows easy connection of the element-side terminals 23 to the first connection terminals 37 of the light emitting element 2 using ultrasonic vibration.

Figure 7:
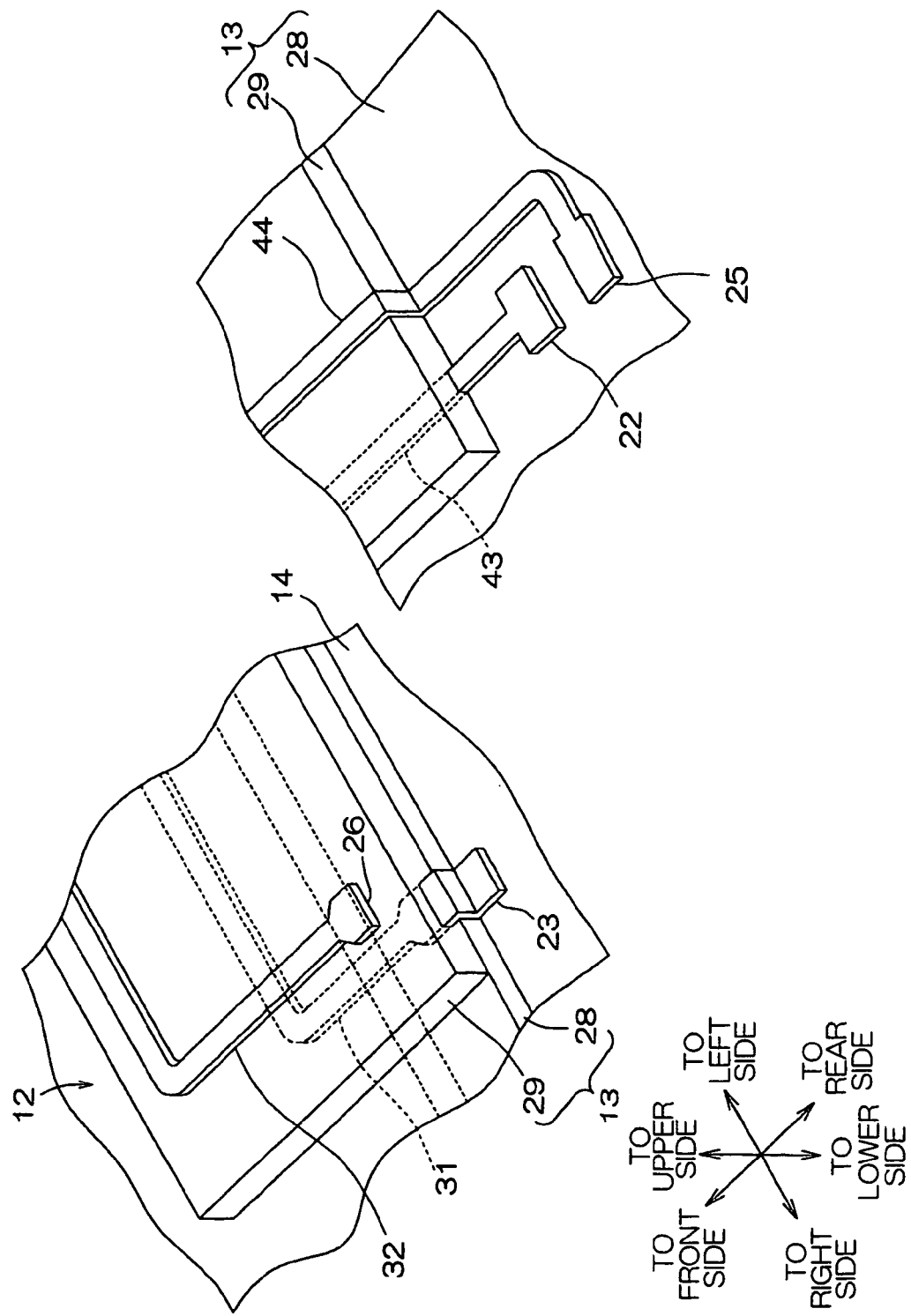
FIG. 7 is an enlarged perspective view of another embodiment (a form in which element wire supply-side portions and head wire external portions are formed on a second insulating base layer) of the suspension board with circuit of the present invention, in which a left-side view is an enlarged perspective view of an element-side terminal and a head-side terminal and a right-view is an enlarged perspective view of a supply-side terminal and an external terminal.
Figure 8:
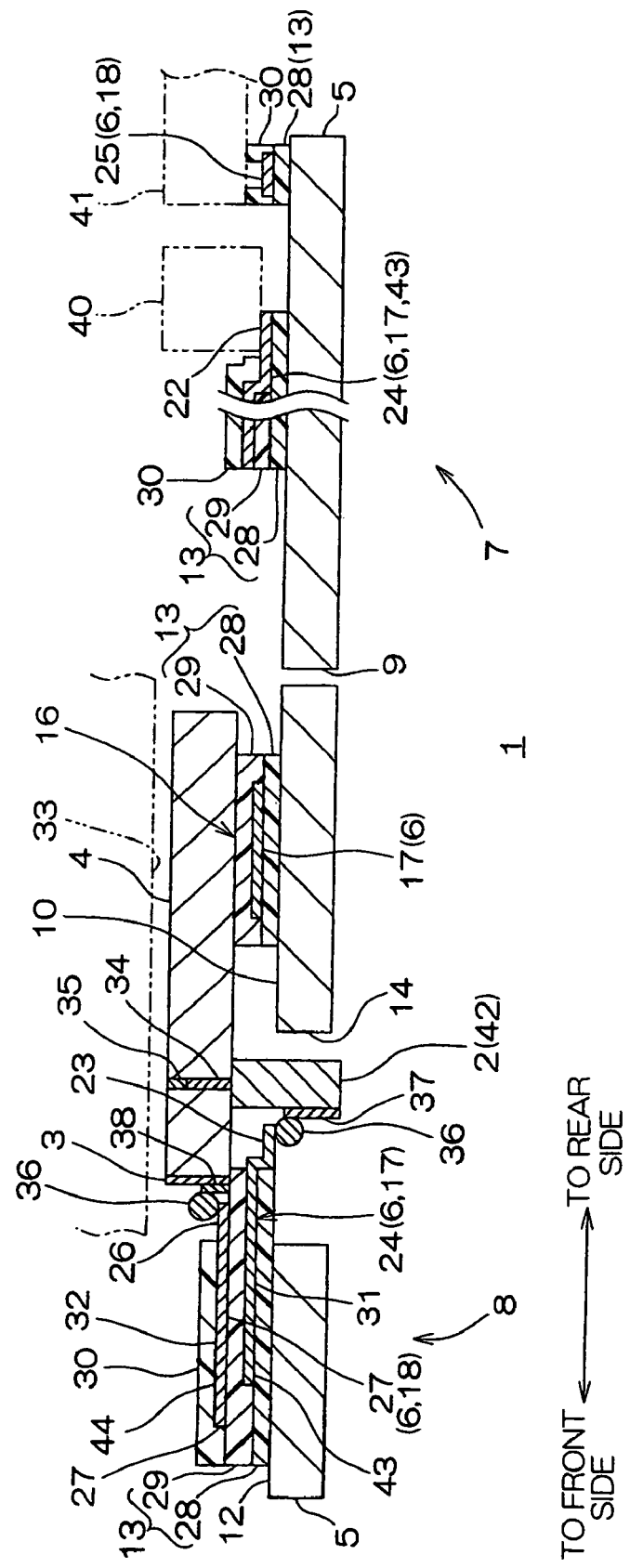
FIG. 8 is a cross-sectional view of the suspension board with circuit shown in FIG. 7, which corresponds to FIG. 2.
Figure 9:
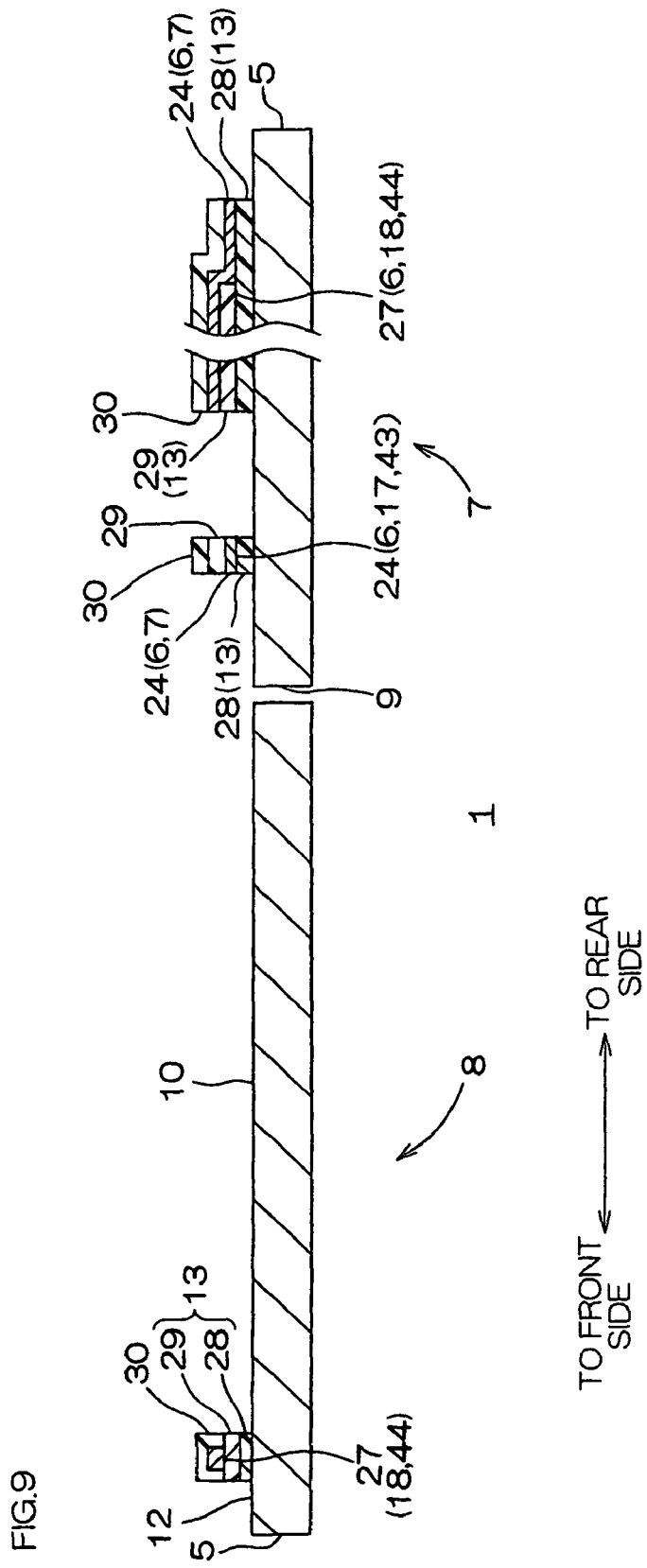
FIG. 9 is a cross-sectional view of the suspension board with circuit shown in FIG. 7, which corresponds to FIG. 3.

FIG. 7 is an enlarged perspective view of another embodiment (a form in which element wire supply-side portions and head wire external portions are formed on a second insulating base layer) of the suspension board with circuit of the present invention. FIGS. 8 and 9 are cross-sectional views of the suspension board with circuit shown in FIG. 7. Note that the members corresponding to the individual members described above are designated by the same reference numerals in each of the subsequent drawings, and a detailed description thereof is omitted.

In the embodiment described above, the second insulating base layer 29 is formed only at the wire turn-back portion 12 of the mounting portion 8. However, as shown in FIGS. 7 to 9, it is also possible to, e.g., form the second insulating base layer 29 continuously over the mounting portion 8 and the wiring portion 7 (except for the rear end portion thereof).

In FIGS. 7 to 9, the second insulating base layer 29 is formed so as to cover the front-side portions of the element wire supply-side portions 43 of the element wires 24 in the mounting portion 8 and the wiring portion 7.

On the other hand, the front-side portions of the head wire external portions 44 of the head wires 27 are formed on the upper surface of the second insulating base layer 29. The head wires 27 are also formed to extend downward along the rear end surface of the second insulating base layer 29 and then be curved rearward.

In the embodiment described above, the description has been given on the assumption that each of the numbers of the head-side terminals 26, the head wires 27, and the external terminals 25 is two. However, each of the numbers thereof is not limited thereto. Each of the numbers of the head-side terminals 26, the head wires 27, and the external terminals 25 can be set appropriately to, e.g., four, six, eight, or the like depending on the application and purpose thereof.

Figure 10:
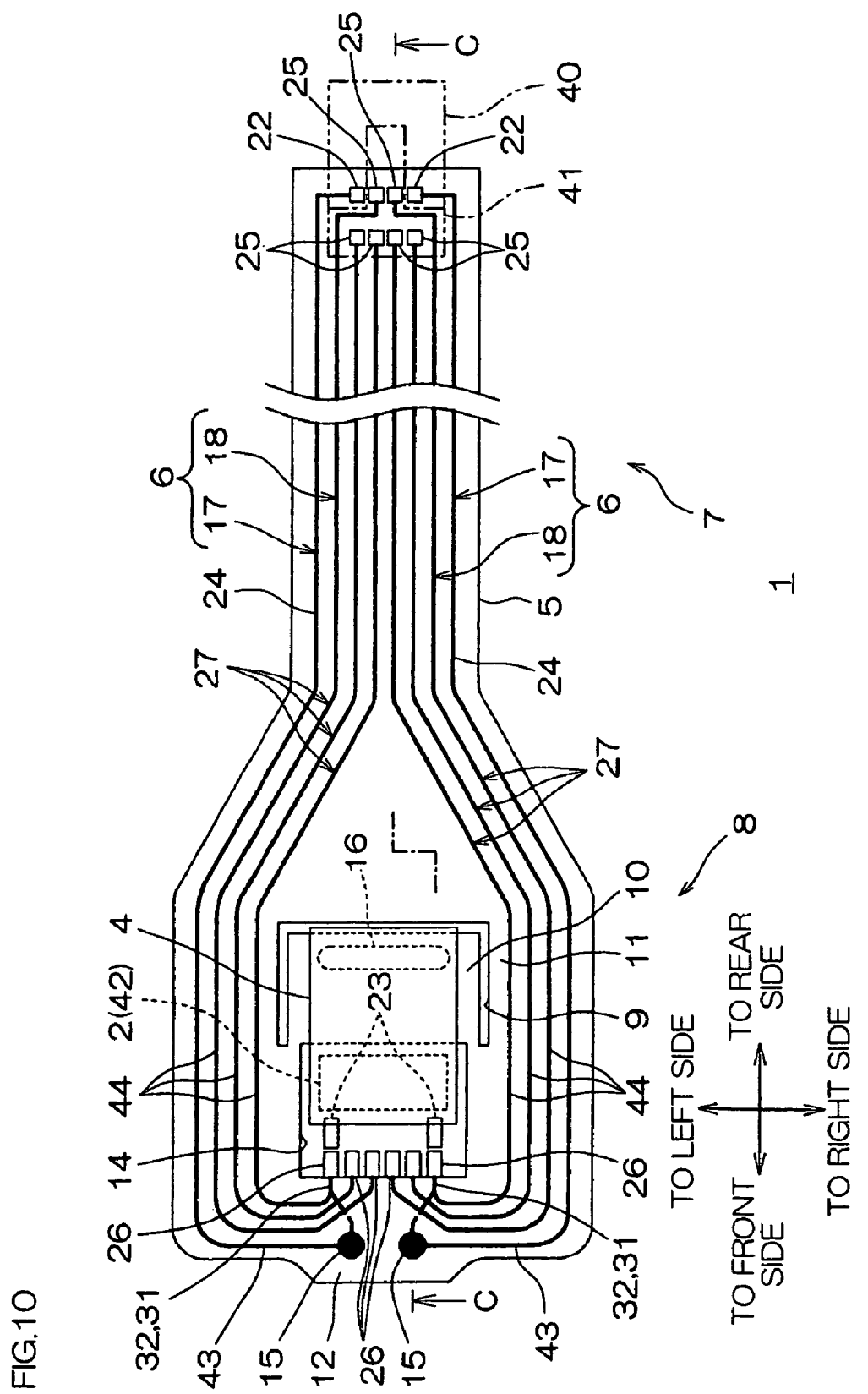
FIG. 10 is a plan view of the other embodiment (the form in which the element wire supply-side portions and the head wire external portions are each formed on the second insulating base layer) of the suspension board with circuit of the present invention.
Figure 11:
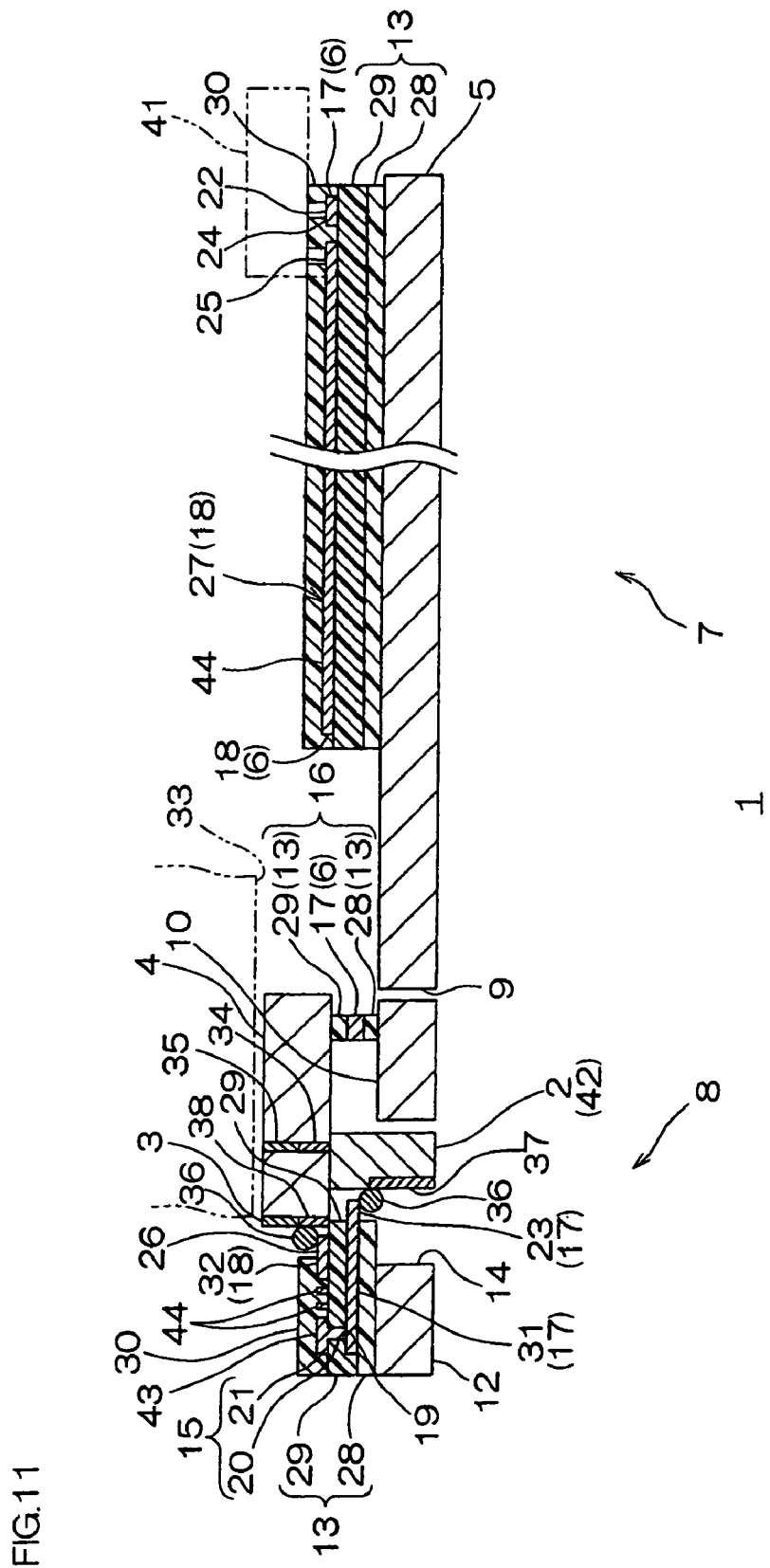
FIG. 11 is a cross-sectional view of the suspension board with circuit shown in FIG. 10 along the line C-C.
Figure 12:
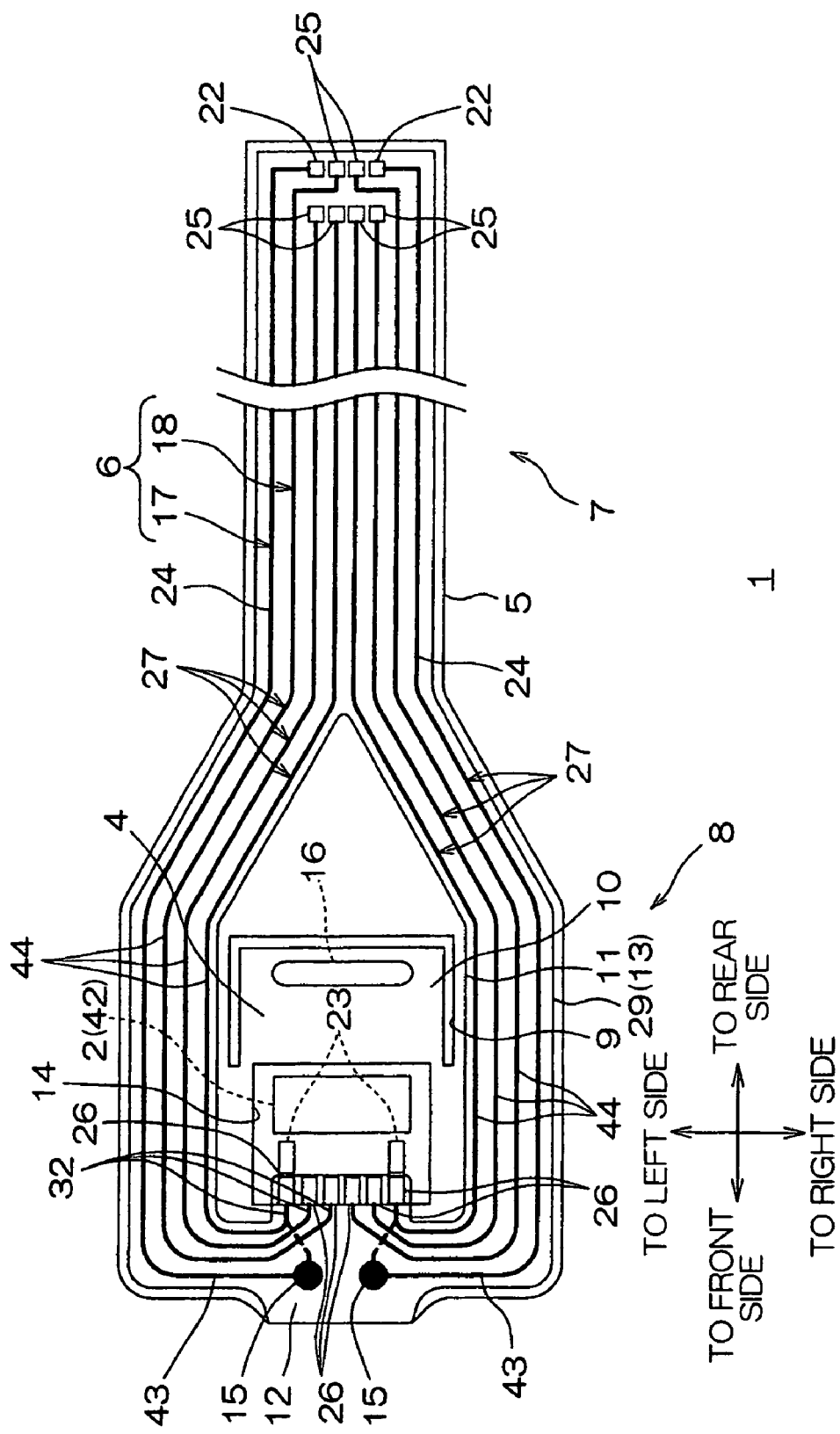
FIG. 12 is a plan view of the suspension board with circuit shown in FIG. 10 when an insulating cover layer is omitted therefrom.
Figure 13:
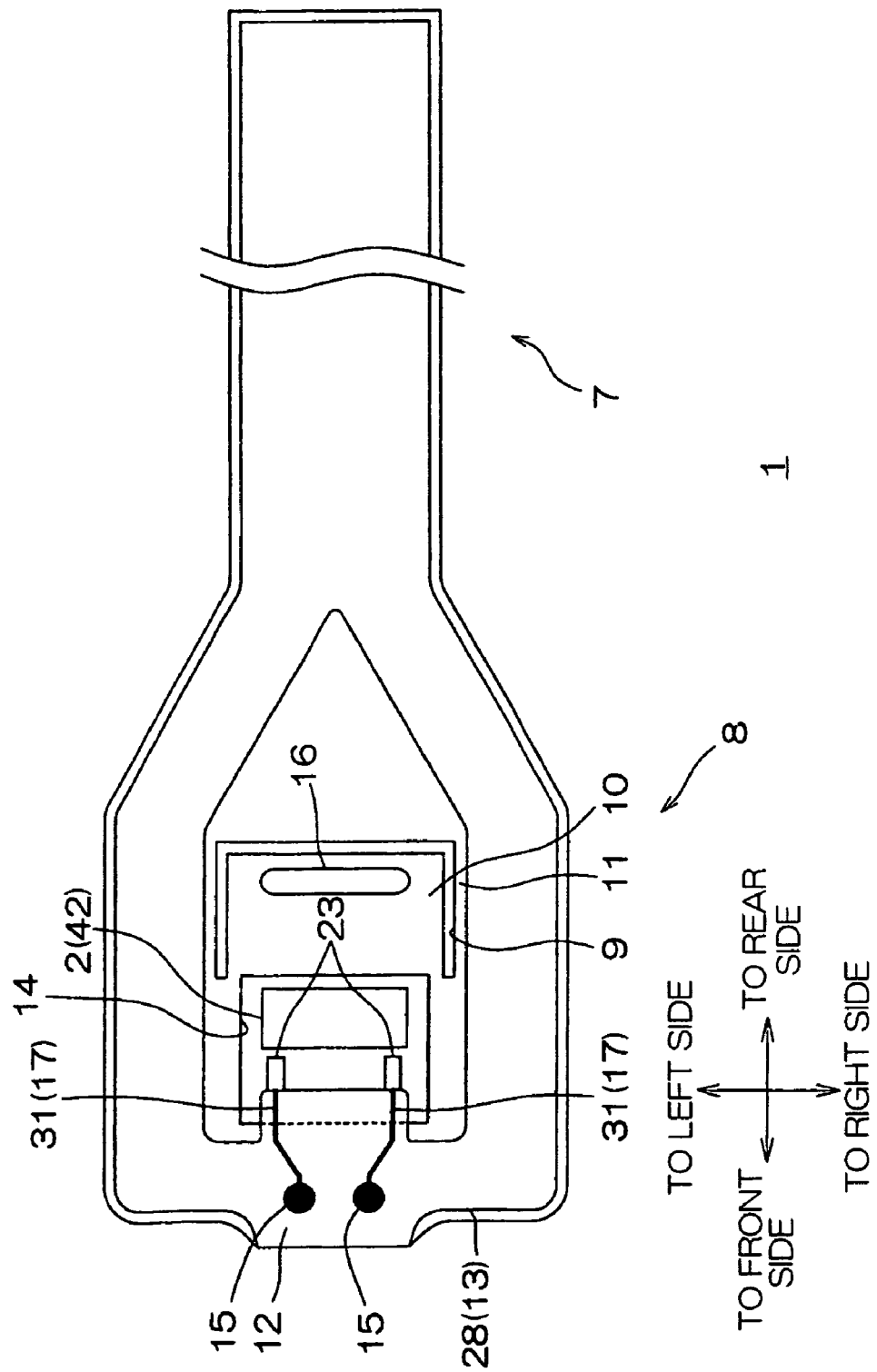
FIG. 13 is a plan view of the suspension board with circuit shown in FIG. 10 when the second insulating base layer, first conductive patterns and second conductive patterns each formed thereon, and the insulating cover layer are omitted therefrom.

FIG. 10 is a plan view of the other embodiment (the form in which the element wire supply-side portions and the head wire external portions are each formed on the second insulating base layer) of the suspension board with circuit of the present invention. FIG. 11 is a cross-sectional view of the suspension board with circuit shown in FIG. 10 along the line C-C. FIG. 12 is a plan view of the suspension board with circuit shown in FIG. 10 when the insulating cover layer is omitted. FIG. 13 is a plan view of the suspension board with circuit shown in FIG. 10 when the second insulating base layer, first conductive patterns and second conductive patterns each formed thereon, and the insulating cover layer are omitted. FIGS. 14 and 15 are process views for illustrating a producing method of the suspension board with circuit shown in FIG. 10, which correspond to the cross-sectional view of FIG. 11.

Note that, in FIG. 10, the insulating base layer 13 and the insulating cover layer 30 are omitted for clear illustration of relative positioning of the conductive layer 6. In FIG. 12, the insulating cover layer 30 is omitted for clear illustration of relative positioning of the conductive layer 6.

In the embodiment of FIG. 4, the element wire supply-side portions 43 and the head wire external portions 44 are each formed on the first insulating base layer 28. However, as shown in FIGS. 10 to 13, the element wire supply-side portions 43 and the head wire external portions 44 can also be each formed on the second insulating base layer 29.

In the embodiment of FIG. 4, the head wires 27 are curved along the front end surface of the second insulating base layer 29 to be connected to the head-side connecting portions 32. However, as shown in FIGS. 10 to 13, it is also possible to, e.g., form the head wires 27 on the upper surface of the second insulating base layer 29 without curving the head wires 27 in the thickness direction, while forming the element wires 24 on the second insulating base layer 29, and further connect the element wires 24 to the element-side connecting portions 31 via a conducting portion 15 (described later) in a base opening 19 (described later) of the second insulating base layer 29.

In FIGS. 10 and 11, in the mounting portion 8 of the suspension board with circuit 1, there are defined the tongue portion 10, the outrigger portions 11, and the wire turn-back portion 12. In the mounting portion 8, there are also provided the opening 14 and the pedestal 16.

The opening 14 is formed on the front side of the tongue portion 10. More specifically, the opening 14 is formed inward of the outrigger portions 11 and between the wire turn-back portion 12 and the tongue portion 10.

The pedestal 16 is disposed on the rear-side portion of the tongue portion 10.

The conductive layer 6 includes the first conductive patterns 17 and the second conductive patterns 18, which are formed to extend continuously over the wiring portion 7 and the mounting portion 8.

The first conductive patterns 17 are formed on the first insulating base layer 28 and the second insulating base layer 29. The first conductive patterns 17 integrally include the supply-side terminals 22, the element-side terminals 23, and the element wires 24.

As shown in FIGS. 11 and 12, the second conductive patterns 18 are formed on the second insulating base layer 29 and integrally include the external terminals 25, the head-side terminals 26, and the head wires 27.

The plurality of (six) external terminals 25 are disposed in aligned and spaced-apart relation in each of the widthwise direction and the front-rear direction.

The plurality of (six) head-side terminals 26 are disposed in the opening 14 of the suspension board with circuit 1 in widthwise spaced-apart relation.

The (six) head wires 27 are formed to be widthwise spaced apart from each other. Of the head wires 27, the head wire external portions 44 are connected to the head-side terminals 26 via the head-side connecting portions 32 at the wire turn-back portion 12 of the mounting portion 8.

Next, the element-side connecting portions 31 of the suspension board with circuit 1 are described in detail with reference to FIGS. 10 to 13.

Note that, in the following description, the element-side connecting portion 31 on one widthwise side (right side) is described by way of example, but the element-side connecting portion 31 on the other widthwise side (left hand) is the same as that on the one widthwise side (right side) so that a description thereof is omitted.

As shown in FIG. 11, the element-side connecting portion 31 is formed on the first insulating base layer 28 and under the second insulating base layer 29.

As shown in FIGS. 11 and 13, the first insulating base layer 28 is provided at the wire turn-back portion 12 and formed to have the same outer shape as the outer shape of the second insulating base layer 29 when projected in the thickness direction. Also, the first insulating base layer 28 is formed to protrude in a generally rectangular shape into the opening 14 of the suspension board with circuit 1 and face the inner surface of the opening 14.

The second insulating base layer 29 is formed on the first insulating base layer 28 so as to cover the element-side connecting portion 31.

Note that, in the wiring portion 7 and the mounting portion 8, the second insulating base layer 29 is formed in a pattern corresponding to the element wire 24 and the supply-side terminal 22 of the first conductive pattern 17 and to the head wires 27, the head-side terminals 26, and the external terminals 25 of the second conductive pattern 18 to be located thereunder.

At the wire turn-back portion 12, the second insulating base layer 29 is also formed with the base opening 19 extending therethrough in the thickness direction. The base opening 19 is provided in the rear-side portion of the wire turn-back portion 12 and formed in a generally circular plan view shape.

As shown in FIGS. 11 and 13, on the upper surface of the first insulating base layer 28, the element-side connecting portion 31 is formed so as to extend in the front-rear direction and be covered with the second insulating base layer 29. Also, as shown in FIGS. 10 and 11, the rear-side portion of the element-side connecting portion 31 is disposed to face, in the vertical (thickness) direction, the rear-side portion of the widthwise outermost head-side connecting portion 32 at the wire turn-back portion 12.

The rear end portion of the element-side connecting portion 31 is continued to the element-side terminal 23 and electrically connected thereto.

The element-side terminal 23 has a generally linear cross-sectional shape and is exposed from the respective rear end edges of the first insulating base layer 28 and the second insulating base layer 29 in the opening 14 of the suspension board with circuit 1.

The front end portion of the element-side connecting portion 31 is electrically connected to the element wire supply-side portion 43 of the element wire 24 via the conducting portion 15 described next.

The conducting portion 15 is formed so as to correspond to the base opening 19.

Specifically, the conducting portion 15 has a generally circular plan view shape and includes a lower portion 20 and an upper portion 21 in continued relation. The lower portion 20 is filled in the base opening 19 of the second insulating base layer 29, while the upper portion 21 covers the upper surface of the second insulating base layer 29 surrounding the base opening 19 and extending from the upper end of the lower portion 20.

The lower portion 20 is formed to be continued to the upper surface of the element-side connecting portion 31 exposed from the base opening 19 of the second insulating base layer 29.

The upper portion 21 is formed to be continued to the top of the lower portion 20 and to the upper surface of the second insulating base layer 29 surrounding the base opening 19. The upper portion 21 is also continued to the rear end edge of the element wire 24 (element wire supply-side portion 43).

Thus, the conducting portion 15 is electrically connected to the element-side terminal 23 via the element-side connecting portion 31 and also electrically connected to the supply-side terminal 22 via the element wire 24 (element wire supply-side portion 43). That is, the element-side terminal 23 and the element-side connecting portion 31 are electrically connected to (in conducting relation with) the element wire 24 and the supply-side terminal 22 via the conducting portion 15.

In addition, the suspension board with circuit 1 has the insulating cover layer 30 provided over the second insulating base layer 29.

Next, a producing method of the suspension board with circuit 1 is described with reference to FIGS. 14 and 15.

First, in the method, as shown in FIG. 14(a), the metal supporting board 5 is prepared.

Next, as shown in FIG. 14(b), the first insulating base layer 28 is formed over the metal supporting board 5.

The first insulating base layer 28 is formed into the foregoing pattern by, e.g., coating a varnish of a photosensitive insulating material onto the metal supporting board 5, drying the coating, exposing it to light, developing it, and heat-curing it. Note that the first insulating base layer 28 is formed also on the portion where the element-side terminals 23 (see FIG. 14(c)) are formed.

Next, as shown in FIG. 14(c), the element-side connecting portions 31 and the element-side terminals 23 are formed on the first insulating base layer 28 by a pattern forming method such as an additive method or a subtractive method. Note that the element-side terminals 23 are formed also on the first insulating base layer 28 which is partially removed by etching in the subsequent step (FIG. 14(h)).

Note that, at the same time, the first conductive pattern 17 is formed also on the first insulating base layer 28 for forming the pedestal 16.

Next, as shown in FIG. 14(d), the second insulating base layer 29 is formed over the element-side connecting portions 31 such that the base opening 19 is formed. At the same time, the second insulating base layer 29 is formed also on the first conductive pattern 17 for forming the pedestal 16.

The second insulating base layer 29 is formed into the foregoing pattern by, e.g., coating a varnish of a photosensitive insulating material onto the metal supporting board 5, the first insulating base layer 28, the element-side connecting portions 31, and the element-side terminals 23, drying the coating, exposing it to light, developing it, and heat-curing it.

Next, as shown in FIG. 14(e), the conducting portion 15, the element wires 24 (element wire supply-side portions 43), the supply-side terminals 22, and the second conductive pattern 18 (the external terminals 25, the head-side terminals 26, and the head wires 27) are formed on the second insulating base layer 29 by a pattern forming method such as an additive method or a subtractive method.

Next, as shown in FIG. 15(f), the insulating cover layer 30 is formed on the second insulating base layer 29.

Specifically, the insulating cover layer 30 is formed in the foregoing pattern by coating a varnish of a photosensitive insulating material onto the second insulating base layer 29, drying the coating, exposing it to light, developing it, and heat-curing it.

Next, as shown in FIG. 15(g), the metal supporting board 5 is trimmed by, e.g., etching or the like, while the opening 14 and the slit 9 are formed in the metal supporting board 5.

Thereafter, as shown in FIG. 15(h), the first insulating base layer 28 formed under the element-side terminals 23 is removed by, e.g., etching or the like.

As a result, the element-side terminals 23 are exposed from the first insulating base layer 28 and the second insulating base layer 29 in the opening 14 of the suspension board with circuit 1 and thereby formed as flying structures having the top and back surfaces thereof exposed.

Subsequently, as shown in FIG. 11, the slider 4 on which the light emitting element 2 and the magnetic head 3 are provided is placed on the upper surface of the pedestal 16 such that the light emitting element 2 is inserted in the opening 14, whereby the slider 4 is mounted on the tongue portion 10.

In this manner, the suspension board with circuit 1 is obtained.

Figure 16:
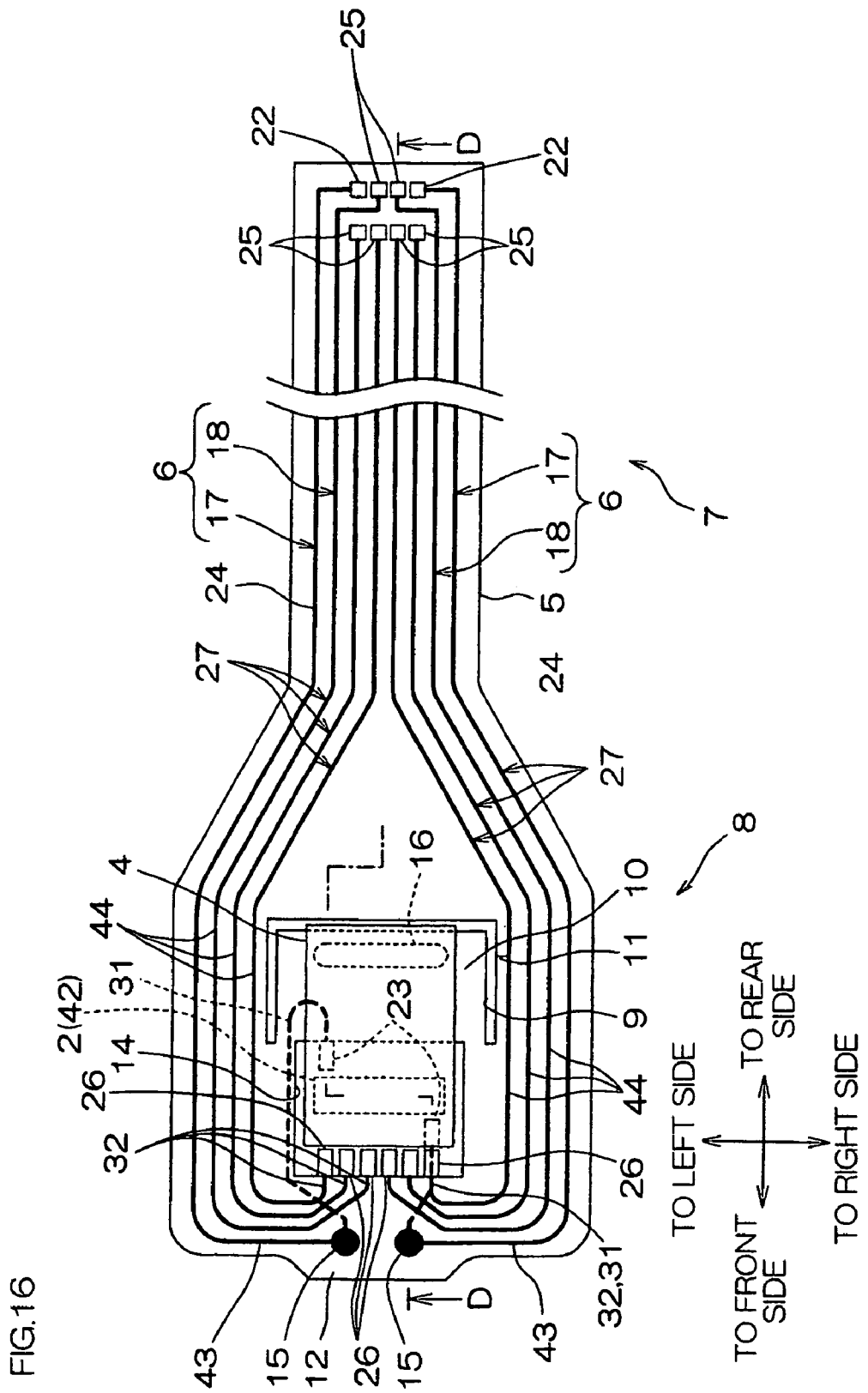
FIG. 16 is a plan view of still another embodiment (a form in which an opening is interposed between a pair of element-side terminals) of the suspension board with circuit of the present invention.
Figure 17:
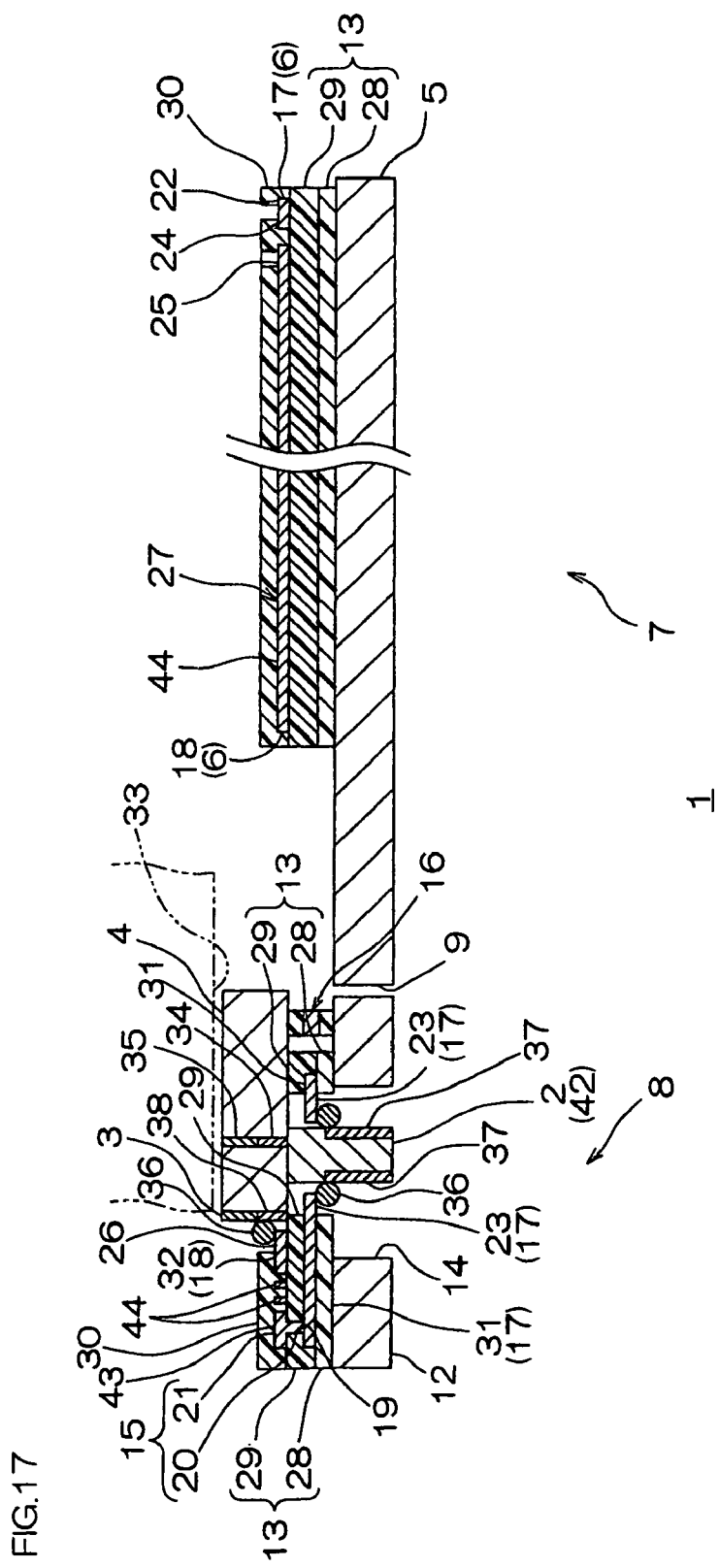
FIG. 17 is a cross-sectional view of the suspension board with circuit shown in FIG. 16 along the line D-D.

FIG. 16 is a plan view of still another embodiment (a form in which an opening is interposed between a pair of element-side terminals) of the suspension board with circuit of the present invention. FIG. 17 is a cross-sectional view of the suspension board with circuit shown in FIG. 16 along the line D-D. FIG. 18 is a plan view of the suspension board with circuit shown in FIG. 16 when a second insulating base layer, first conductive patterns and second conductive patterns each formed thereon, and an insulating cover layer are omitted therefrom.

Note that, in FIG. 16, the insulating base layer 13 and the insulating cover layer 30 are omitted for clear illustration of the relative positioning of the conductive layer 6.

In each of the embodiments described above, the pair of element-side terminals 23 are provided so as to face the inner surface of the opening 14. However, it is also possible to provide, e.g., one element-side terminal 23 or three or more element-side terminals 23, though not shown. Preferably, at least one pair of element-side terminals 23 are provided.

In each of the embodiments described above, the pair of (two) element-side terminals 23 are each disposed on one side (front side) of the opening 14. However, as shown in FIGS. 16 to 18, it is also possible to, e.g., dispose the one pair of element-side terminals 23 on both front and rear sides of the opening 14, respectively.

That is, the pair of element-side terminals 23 are disposed such that the opening 14 is interposed therebetween.

More specifically, in FIGS. 16 to 18, the plurality of (two) element-side terminals 23 are paired up and respectively formed on the front side and rear side of the opening 14 to protrude thereinto.

The element-side terminal 23 on one widthwise side (left side) is disposed on the front side of the opening 14, while the element-side terminal 23 on the other widthwise side (right side) is disposed on the rear side of the opening 14.

The element-side connecting portion 31 electrically connected to the element-side terminal 23 on one widthwise side (left side) is formed to extend obliquely rearward from the conducting portion 15 in one widthwise (leftward) direction, then extend rearward along one widthwise end edge of the opening 14, subsequently be turned back toward the front side on the rear side of the opening 14, and finally reach the element-side terminal 23 on one widthwise side.

Under the element-side connecting portions 31, the first insulating base layer 28 corresponding thereto is formed while, on the element-side connecting portions 31, the second insulating base layer 29 is formed.

The profile of the element-side terminal 23 on one widthwise side and the insulating base layer 13 (the first insulating base layer 28 and the second insulating base layer 29) formed on both upper and lower sides of the element-side connecting portion 31 continued thereto is formed point-symmetrically to the profile of the element-side terminal 23 on the other widthwise side and the insulating base layer 13 (the first insulating base layer 28 and the second insulating base layer 29) formed on both upper and lower sides of the element-side connecting portion 31 continued thereto with respect to the center of the opening 14.

On the front end surface and rear end surface of the lower portion of the light emitting element 2, the respective first connection terminals 37 are provided.

In the suspension board with circuit 1 described above, the element-side terminals 23 electrically coupled to the light emitting element 2 are disposed such that the opening 14 is interposed therebetween. Accordingly, the light emitting element 2 can be connected in two directions to the first conductive pattern 18.

Therefore, the element-side terminals 23 connecting the light emitting element 2 and the first conductive pattern 18 can be disposed in scattered relation, and the wiring density can be reduced compared with that in the case where the light emitting element 2 is connected in one direction to the first conductive pattern 18. As a result, it is possible to suppress a short circuit and improve connection reliability.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A suspension board with circuit, comprising:
a metal supporting board;
an insulating layer formed on the metal supporting board; and
a conductive layer formed on the insulating layer, wherein
the insulating layer includes a first insulating layer and a second insulating layer formed on the first insulating layer,
the conductive layer includes a first conductive pattern and a second conductive pattern,
the first conductive pattern includes a first connecting portion formed on the first insulating layer and under the second insulating layer and a first terminal formed so as to be continued to the first connecting portion,
the second conductive pattern includes a second connecting portion formed on the second insulating layer and a second terminal formed so as to be continued to the second connecting portion,
the suspension board with circuit is formed with an opening extending through the suspension board with circuit in a thickness direction thereof, and
a slider on which an electronic element and a magnetic head are provided is provided such that the electronic element is inserted in the opening to be electrically connected to the first terminal and the magnetic head is electrically connected to the second terminal.

2. The suspension board with circuit according to claim 1, wherein
the first conductive pattern includes a first wire electrically connected to the first connecting portion,
the second conductive pattern includes a second wire electrically connected to the second connecting portion, and
the first wire and the second wire are formed on the first insulating layer.

3. The suspension board with circuit according to claim 1, wherein
the first conductive pattern includes a first wire electrically connected to the first connecting portion,
the second conductive pattern includes a second wire electrically connected to the second connecting portion, and
the first wire and the second wire are formed on the second insulating layer.

4. The suspension board with circuit according to claim 1, wherein
a third insulating layer is formed on the second connecting portion,
the second terminal is formed on the second insulating layer so as to be exposed from the third insulating layer, and the first terminal is formed in the opening so as to be exposed from the first insulating layer and the second insulating layer.

5. The suspension board with circuit according to claim 1, wherein at least a pair of the first terminals are provided so as to face the opening.

6. The suspension board with circuit according to claim 5, wherein the at least one pair of first terminals are disposed such that the opening is interposed therebetween.

7. The suspension board with circuit according to claim 1, wherein
the electronic element is a light emitting element, and
the slider includes an optical waveguide and a near-field light generating member.

8. The suspension board with circuit according to claim 1, wherein the electronic element is a testing element.

9. A method of producing a suspension board with circuit, comprising:
preparing a metal supporting board;
forming a first insulating layer on the metal supporting board;
forming a first conductive pattern including a first connecting portion formed on the first insulating layer and a first terminal portion continued to the first connecting portion;
forming a second insulating layer on the first connecting portion;
forming a second conductive pattern including a second connecting portion formed on the second insulating layer and a second terminal continued to the second connecting portion;
forming the suspension board with circuit with an opening extending through the suspension board with circuit in a thickness direction thereof; and
providing, on the suspension board with circuit, a slider on which an electronic element and a magnetic head are provided such that the electronic element is inserted in the opening to be electrically connected to the first terminal and the magnetic head is electrically connected to the second terminal.

* * * * *